United States Patent
Sumi et al.

(10) Patent No.: US 10,819,922 B2
(45) Date of Patent: Oct. 27, 2020

(54) SOLID-STATE IMAGING ELEMENT AND IMAGING DEVICE

(71) Applicant: nanolux co. ltd., Tsukuba-shi, Ibaraki (JP)

(72) Inventors: Hirofumi Sumi, Tsukuba (JP); Koichiro Ishigami, Tsukuba (JP); Motoshi Sobue, Tsukuba (JP)

(73) Assignee: nanolux co. ltd., Tsukuba-shi, Ibaraki (JP)

(*) Notice: Subject to any disclaimer, the term of this patent is extended or adjusted under 35 U.S.C. 154(b) by 0 days.

(21) Appl. No.: 16/302,267

(22) PCT Filed: Feb. 21, 2018

(86) PCT No.: PCT/JP2018/006193
§ 371 (c)(1),
(2) Date: Nov. 16, 2018

(87) PCT Pub. No.: WO2018/155486
PCT Pub. Date: Aug. 30, 2018

(65) Prior Publication Data
US 2019/0297278 A1 Sep. 26, 2019

(30) Foreign Application Priority Data

Feb. 21, 2017 (JP) .................... 2017-030535
Feb. 21, 2017 (JP) .................... 2017-030542

(51) Int. Cl.
*H04N 7/18* (2006.01)
*H04N 5/33* (2006.01)
(Continued)

(52) U.S. Cl.
CPC ............... *H04N 5/332* (2013.01); *G02B 1/11* (2013.01); *G02B 5/20* (2013.01); *G02B 5/28* (2013.01);
(Continued)

(58) Field of Classification Search
CPC ...................................................... H04N 5/332
(Continued)

(56) References Cited

U.S. PATENT DOCUMENTS 4,922,282 A * 5/1990 Koyama ................. G02B 7/34
250/201.2
5,521,733 A * 5/1996 Akiyama ........... G02B 6/29362
398/48
(Continued)

FOREIGN PATENT DOCUMENTS

JP        2008-244246 A     10/2008
JP    WO2007/086155 A1     6/2009
(Continued)

OTHER PUBLICATIONS

International Search Report for corresponding international application PCT/JP2018/006193 dated May 1, 2018.

*Primary Examiner* — Leron Beck
(74) *Attorney, Agent, or Firm* — Hauptman Ham, LLP

(57) ABSTRACT

A solid-state imaging element comprising a visible light detection area including a first visible light pixel for receiving first visible light, a second visible light pixel for receiving second visible light having a wavelength different from a wavelength of the first visible light, and a third visible light pixel for receiving third visible light having a wavelength different from the wavelengths of the first visible light and the second visible light; and a near infrared light detection area including a first near infrared pixel for receiving first near infrared light, a second near infrared light pixel for receiving second near infrared light having a wavelength different from a wavelength of the first near infrared light, and a third near infrared light pixel for receiving third near infrared light having a wavelength different from the wavelengths of the first near infrared light and the second near infrared light.

24 Claims, 26 Drawing Sheets

(51) Int. Cl.
*H04N 9/04* (2006.01)
*G02B 1/11* (2015.01)
*G02B 5/28* (2006.01)
*H01L 27/146* (2006.01)
*G02B 5/20* (2006.01)
*H04N 9/07* (2006.01)

(52) U.S. Cl.
CPC ............ *G02B 5/281* (2013.01); *H01L 27/146* (2013.01); *H01L 27/14621* (2013.01); *H01L 27/14645* (2013.01); *H04N 9/04553* (2018.08); *H04N 9/04559* (2018.08); *H04N 9/07* (2013.01)

(58) Field of Classification Search
USPC .......................................................... 348/148
See application file for complete search history.

(56) References Cited

U.S. PATENT DOCUMENTS

| | | | | |
|---|---|---|---|---|
| 5,924,792 | A * | 7/1999 | Cassarly | G02B 6/0006 362/294 |
| 6,301,042 | B1 * | 10/2001 | Pelekhaty | G02B 5/281 359/359 |
| 6,380,539 | B1 * | 4/2002 | Edgar | H04N 1/00795 250/339.05 |
| 6,462,866 | B1 * | 10/2002 | Sugiyama | G02B 5/282 359/356 |
| 6,774,963 | B1 * | 8/2004 | Nakao | G02F 1/133514 349/104 |
| 8,854,472 | B1 | 10/2014 | Nagamune | |
| 10,019,112 | B2 * | 7/2018 | Bakin | G06F 3/042 |
| 10,389,922 | B2 * | 8/2019 | Takita | H01L 27/14647 |
| 2002/0134940 | A1 * | 9/2002 | Ohkubo | G01N 21/3504 250/339.13 |
| 2005/0174512 | A1 * | 8/2005 | Roh | G02F 1/133514 349/106 |
| 2006/0124833 | A1 * | 6/2006 | Toda | H01L 27/14621 250/214 R |
| 2006/0291061 | A1 * | 12/2006 | Iyama | G02B 5/282 359/614 |
| 2007/0051876 | A1 * | 3/2007 | Sumi | G02B 5/282 250/214 R |
| 2007/0182844 | A1 * | 8/2007 | Allman | G02B 5/04 348/345 |
| 2008/0173795 | A1 * | 7/2008 | Kang | H01L 27/14621 250/208.1 |
| 2008/0204740 | A1 * | 8/2008 | Berg | G01B 11/16 356/239.2 |
| 2008/0315104 | A1 * | 12/2008 | Nam | H01L 27/14603 250/370.08 |
| 2009/0009621 | A1 | 1/2009 | Yamaguchi et al. | |
| 2009/0190226 | A1 * | 7/2009 | Mehrtens | F21V 9/08 359/589 |
| 2010/0220228 | A1 * | 9/2010 | Otake | H01L 27/14621 348/311 |
| 2011/0051260 | A1 * | 3/2011 | Nakayama | G02B 5/205 359/738 |
| 2011/0074960 | A1 | 3/2011 | Nagata | |
| 2011/0080636 | A1 * | 4/2011 | Nakanishi | G02B 5/223 359/359 |
| 2011/0169984 | A1 * | 7/2011 | Noguchi | H04N 5/332 348/234 |
| 2012/0145901 | A1 | 6/2012 | Kakiuchi et al. | |
| 2012/0202281 | A1 * | 8/2012 | Gonzalez | C12M 21/02 435/292.1 |
| 2013/0002882 | A1 * | 1/2013 | Onozawa | H04N 5/2353 348/164 |
| 2013/0188057 | A1 * | 7/2013 | Lin | H04N 5/332 348/164 |
| 2013/0242040 | A1 * | 9/2013 | Masuda | H04N 5/2254 348/36 |
| 2013/0334402 | A1 | 12/2013 | Izuha et al. | |
| 2014/0027653 | A1 * | 1/2014 | Mori | G02B 5/22 250/458.1 |
| 2015/0130908 | A1 * | 5/2015 | Kang | G06T 7/50 348/46 |
| 2015/0221691 | A1 * | 8/2015 | Watanabe | H04N 5/332 348/164 |
| 2015/0260888 | A1 * | 9/2015 | Yoshihara | G02B 5/26 359/359 |
| 2015/0268396 | A1 * | 9/2015 | Weber | G02B 5/282 359/359 |
| 2015/0341573 | A1 * | 11/2015 | Matsuo | H04N 5/33 348/135 |
| 2016/0161332 | A1 * | 6/2016 | Townsend | G02B 5/201 250/208.2 |
| 2016/0169795 | A1 * | 6/2016 | Kumagai | G01J 3/10 250/339.05 |
| 2016/0341973 | A1 * | 11/2016 | Ida | G02B 27/58 |
| 2017/0041560 | A1 | 2/2017 | Gotoh et al. | |
| 2017/0048429 | A1 * | 2/2017 | Takita | H04N 5/2253 |
| 2017/0079741 | A1 * | 3/2017 | Makinouchi | A61B 90/36 |
| 2017/0257546 | A1 * | 9/2017 | Shahid | H04N 5/2254 |
| 2018/0234644 | A1 * | 8/2018 | Li | G02B 5/201 |

FOREIGN PATENT DOCUMENTS

| | | |
|---|---|---|
| JP | 2011-77410 A | 4/2011 |
| JP | 2012-137728 A | 7/2012 |
| JP | 2014-17468 A | 1/2014 |
| JP | 2016-174028 A | 9/2016 |
| WO | 2011013765 A1 | 2/2011 |
| WO | 2015/159651 A1 | 10/2015 |
| WO | 2016/013520 A1 | 1/2016 |
| WO | 2016/158128 A1 | 10/2016 |

* cited by examiner

Fig.7

| | | | | | | | | | | | |
|---|---|---|---|---|---|---|---|---|---|---|---|
| B | G | B | G | B | G | B | G | B | G | B | G |
| G | R | G | R | G | R | G | R | G | R | G | R |
| B | G | B | G | B | G | B | G | B | G | B | G |
| G | R | G | R | G | R | G | R | G | R | G | R |
| NIR-B | NIR-G | NIR-B | NIR-G | NIR-B | NIR-G | NIR-B | NIR-G | NIR-B | NIR-G | NIR-B | NIR-G |
| NIR-G | NIR-R | NIR-G | NIR-R | NIR-G | NIR-R | NIR-G | NIR-R | NIR-G | NIR-R | NIR-G | NIR-R |
| NIR-B | NIR-G | NIR-B | NIR-G | NIR-B | NIR-G | NIR-B | NIR-G | NIR-B | NIR-G | NIR-B | NIR-G |
| NIR-G | NIR-R | NIR-G | NIR-R | NIR-G | NIR-R | NIR-G | NIR-R | NIR-G | NIR-R | NIR-G | NIR-R | a b a b a b

Fig.27 a

| R | G |
|---|---|
| G | B | b

| R+<br>NIR-R | G+<br>NIR-G |
|---|---|
| G+<br>NIR-G | B+<br>NIR-B |

SOLID-STATE IMAGING ELEMENT AND IMAGING DEVICE

CROSS REFERENCE TO RELATED APPLICATION

This application claims the priority of Japanese Patent Application Nos. 2017-030535, filed on Feb. 21, 2017 and 2017-030542 filed on Feb. 21, 2017, in the JPO (Japanese Patent Office). Further, this application is the National Phase Application of International Application No. PCT/JP2018/006193, filed on Feb. 21, 2018, which designates the United States and was published in Japan. Both of the priority documents are hereby incorporated by reference in their entireties.

TECHNICAL FIELD

The present invention relates to a solid-state imaging element, and an imaging device including the solid-state imaging element for photographing a color image. More specifically, the present invention relates to a solid-state imaging element and an imaging device for detecting visible light and near infrared light.

BACKGROUND ART

An image photographing apparatus for forming a color image of a subject by detecting infrared light reflected from the subject or infrared light radiated from the subject is proposed (see Patent Literature 1). By using the technique described in Patent Literature 1, it becomes possible to capture a color image even in a very low illumination environment or in darkness.

Meanwhile, in order to implement the technique described in Patent Literature 1, it is necessary to detect near infrared light rays (NIR-R, -G, -B) of three types associated with red light (R), green light (G), and blue light (B). Conventionally, as a solid-state imaging element capable of detecting both light in a visible range and light in a near infrared range, for example, there is proposed a configuration in which a pixel for detecting red light (R), green light (G), or blue light (B), and a pixel for detecting near infrared light (NIR) are arranged on a same substrate (see e.g., Patent Literatures 2 to 4).

Further, a light detection apparatus for respectively detecting red light (R), green light (G), or blue light (B), and near infrared light rays (NIR-R, -G, -B) of three types associated therewith by a same pixel is also proposed (see Patent Literatures 5 and 6). For example, in the light detection apparatus described in Patent Literature 5, pixels including an optical filter for transmitting only red light (R) and near infrared light (NIR-R) associated therewith, an optical filter for transmitting only green light (G) and near infrared light (NIR-G) associated therewith, and an optical filter for transmitting only blue light (B) and near infrared light (NIR-B) associated therewith are periodically arranged.

CITATION LIST

Patent Literature

Patent Literature 1: International Publication No. 2011/013765
Patent Literature 2: International Publication No. 2007/086155
Patent Literature 3: Japanese Unexamined Patent Application Publication No. 2008-244246
Patent Literature 4: Japanese Unexamined Patent Application Publication No. 2016-174028
Patent Literature 5: International Publication No. 2015/159651
Patent Literature 6: International Publication No. 2016/158128

SUMMARY OF THE INVENTION

Technical Problem

However, the above-described conventional solid-state imaging elements involve the below-described problems. First of all, pixels for near infrared light detection in the solid-state imaging elements described in Patent Literatures 2 to 4 have a configuration such that incidence of visible light is blocked by providing only an RGB color filter without providing an infrared filter. Therefore, it is not possible to selectively detect near infrared light of a specific wavelength by these solid-state imaging elements. Specifically, in the solid-state imaging elements described in Patent Literatures 2 to 4, it is difficult to capture a color image in a very low illumination environment or in darkness.

Meanwhile, in the light detection apparatuses described in Patent Literatures 5 and 6, application to the technique described in Patent Literature 1 is assumed. It is difficult to design an optical filter for transmitting only a specific wavelength in a visible range and a specific wavelength in a near infrared range, and reflecting light other than the above. Further, when the above-described optical filter has a structure such that a high refractive index layer and a low refractive index layer as described in Patent Literature 5 are laminated, high-accuracy film thickness control is required, and a manufacturing process also becomes cumbersome. Therefore, a further improvement is demanded for the light detection apparatuses described in Patent Literatures 5 and 6 in terms of manufacturing cost and manufacturing process.

In view of the above, an object of the present invention is to provide a solid-state imaging element and an imaging device capable of photographing a color image in an illumination environment of a wide range from normal illumination to darkness (zero lux).

Solution to Problem

A solid-state imaging element according to the present invention includes: a visible light detection area for receiving visible light, and a near infrared light detection area for receiving near infrared light. In the visible light detection area, a first visible light pixel for receiving first visible light, a second visible light pixel for receiving second visible light having a wavelength different from a wavelength of the first visible light, and a third visible light pixel for receiving third visible light having a wavelength different from the wavelengths of the first visible light and the second visible light are provided. In the near infrared light detection area, a first near infrared light pixel for receiving first near infrared light, a second near infrared light pixel for receiving second near infrared light having a wavelength different from a wavelength of the first near infrared light, and a third near infrared light pixel for receiving third near infrared light having a wavelength different from the wavelengths of the first near infrared light and the second near infrared light are provided.

Alternatively, a solid-state imaging element according to the present invention includes: a first pixel for receiving first visible light, and first near infrared light having a correlation with the first visible light; a second pixel for receiving second visible light having a wavelength different from a wavelength of the first visible light, and second near infrared light having a correlation with the second visible light; and a third pixel for receiving third visible light having a wavelength different from the wavelengths of the first visible light and the second visible light, and third near infrared light having a correlation with the third visible light. An optical filter for reflecting and/or absorbing visible light other than the first visible light, and an optical filter for reflecting and/or absorbing near infrared light in a specific wavelength range are laminated on the first pixel. An optical filter for reflecting and/or absorbing visible light other than the second visible light, and an optical filter for reflecting and/or absorbing near infrared light in a specific wavelength range are laminated on the second pixel. An optical filter for reflecting and/or absorbing visible light other than the third visible light, and an optical filter for reflecting and/or absorbing near infrared light in a specific wavelength range are laminated on the third pixel.

An imaging device according to the present invention includes the above-described solid-state imaging element.

The imaging device may include an image generation unit for analyzing a signal acquired by the above-described solid-state imaging element, and generating a color image based on first visible light, second visible light, and third visible light and/or a color image based on first near infrared light, second near infrared light, and third near infrared light.

Advantageous Effects of Invention

According to the present invention, it is possible to implement a solid-state imaging element and an imaging device capable of photographing a color image in an illumination environment of a wide range from normal illumination to darkness (zero lux), and easily manufacturable as compared with a conventional product.

BRIEF DESCRIPTION OF DRAWINGS

FIG. 7 is a plan view illustrating a pixel arrangement example of a solid-state imaging element as a modification of the first embodiment according to the present invention.

Figure 24:
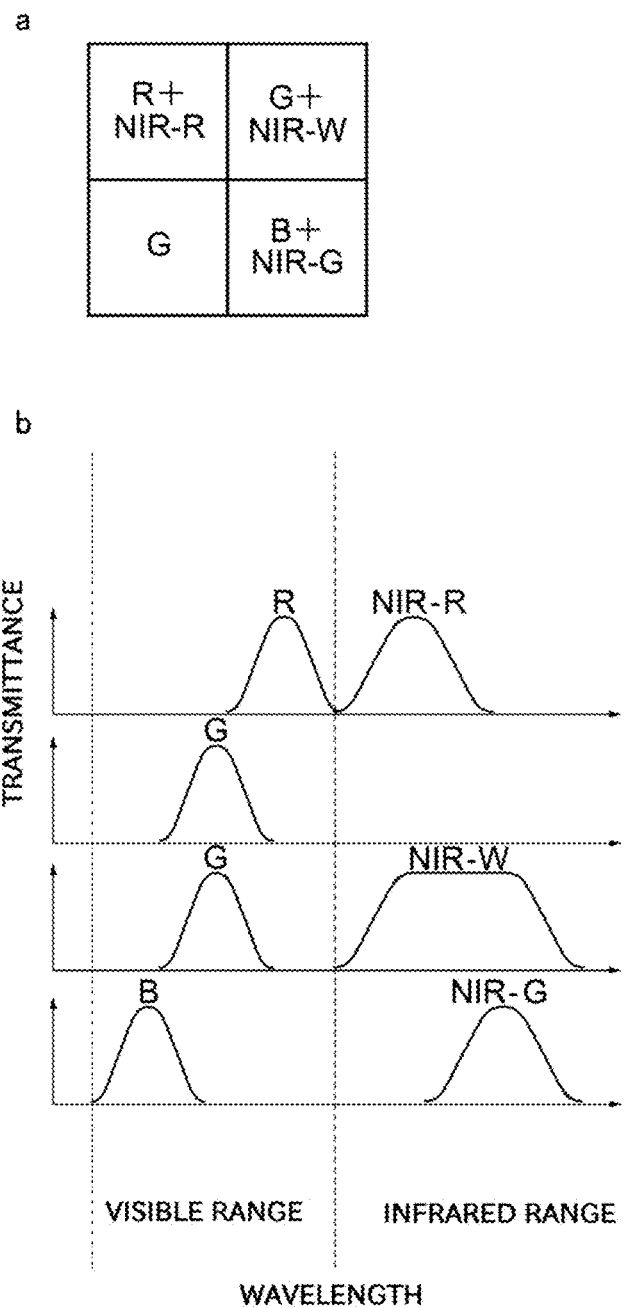
FIG. 24a is a plan view illustrating a pixel arrangement example of a solid-state imaging element in a fourth embodiment according to the present invention, and FIG.

24b is a diagram illustrating spectral characteristics of an optical filter provided on each pixel in FIG. 24a.

Figure 25:
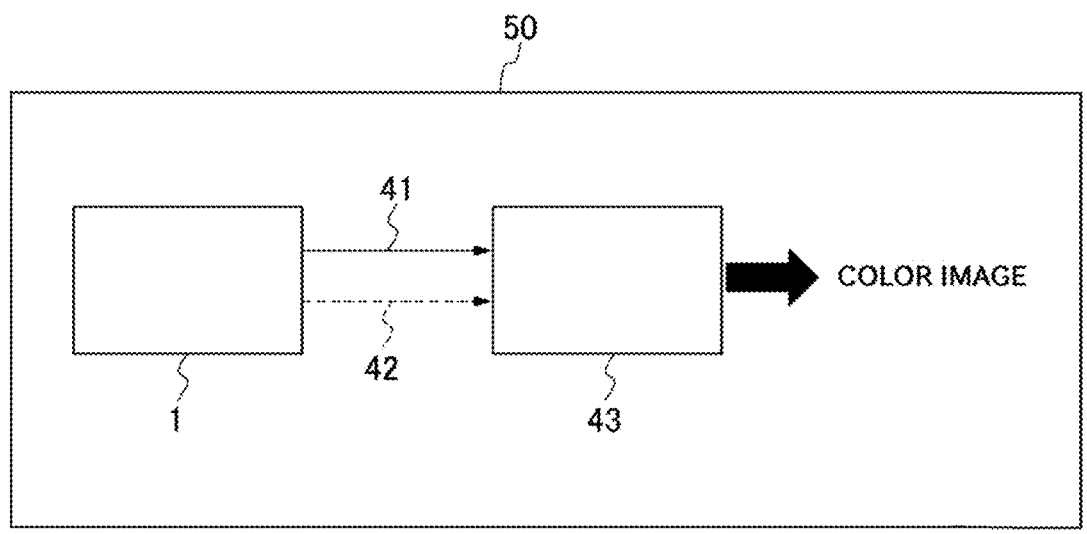

FIG. 25 is a conceptual diagram illustrating a basic configuration of an imaging device in a fifth embodiment according to the present invention.

Figure 26:
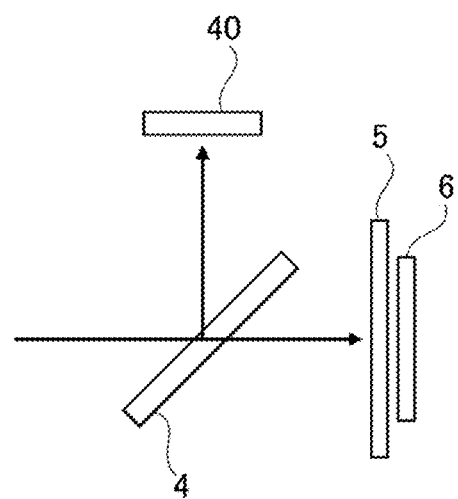

FIG. 26 is a diagram schematically illustrating a configuration of an imaging device as a modification of the fifth embodiment according to the present invention.

Figure 27:
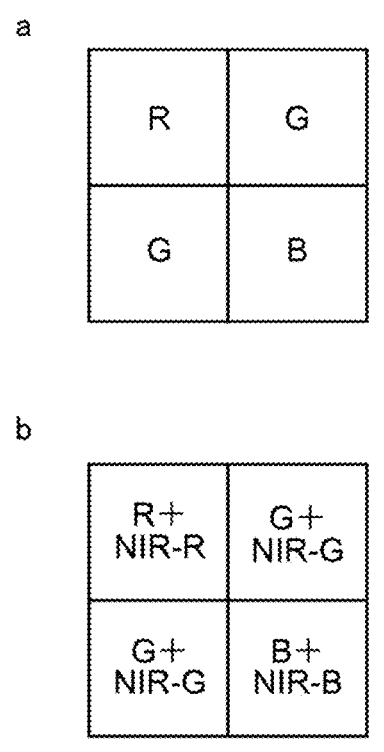

FIG. 27a is a plan view illustrating a pixel arrangement example of a solid-state imaging element 6 for visible light detection, and FIG. 27b is a plan view illustrating a pixel arrangement example of a solid-state imaging element 40 for near infrared light detection.

DESCRIPTION OF EMBODIMENTS

In the following, embodiments for carrying out the present invention will be described in detail with reference to the accompanying drawings. Note that the present invention is not limited to the below-described embodiments.

First Embodiment

Figure 1:
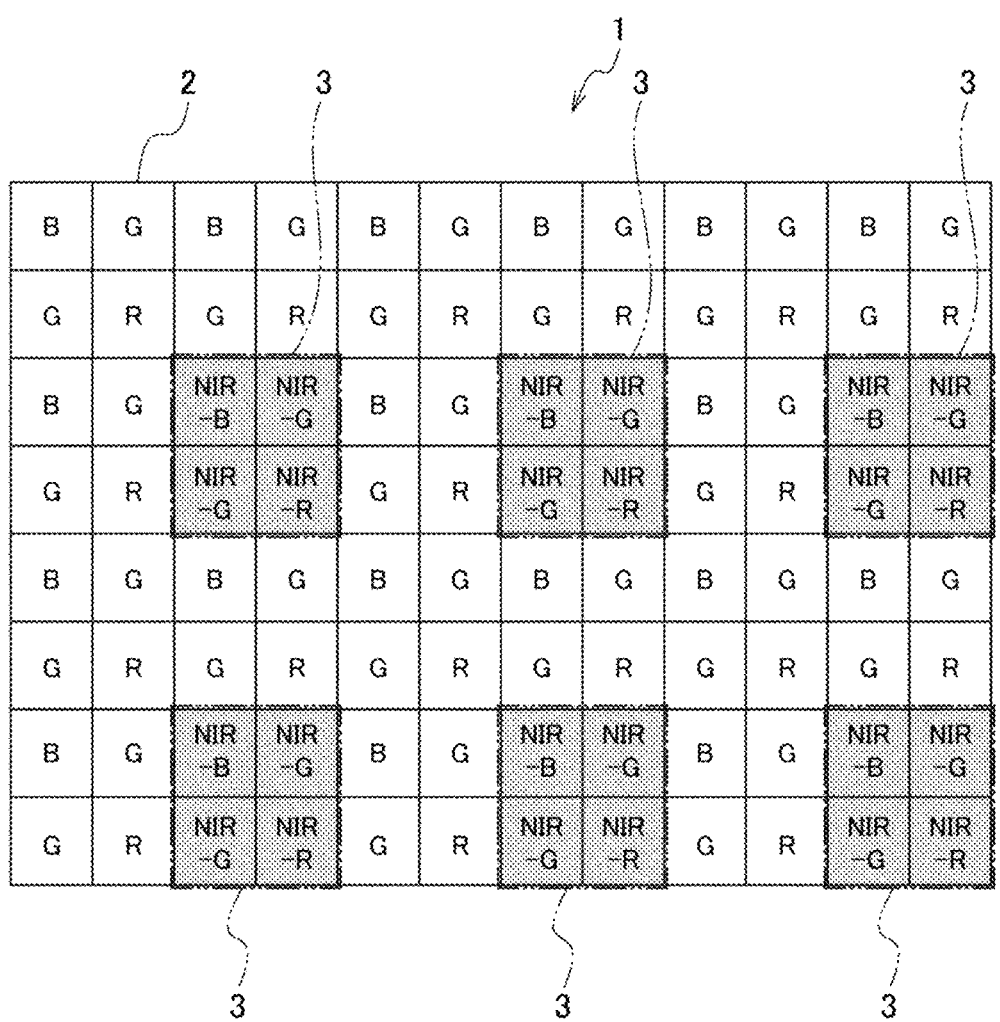
FIG. 1 is a plan view illustrating a pixel arrangement example of a solid-state imaging element of a first embodiment according to the present invention.
Figure 2:
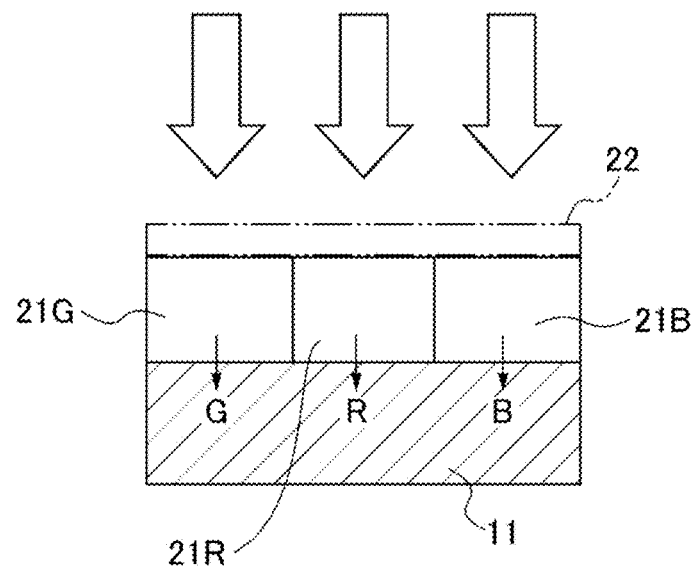
FIGS. 2a and 2b are sectional views illustrating a schematic configuration of a pixel portion of the solid-state imaging element in the first embodiment according to the present invention, wherein a illustrates a pixel configuration of a visible light detection area, and b illustrates a pixel configuration of a near infrared light detection area.
Figure 2:
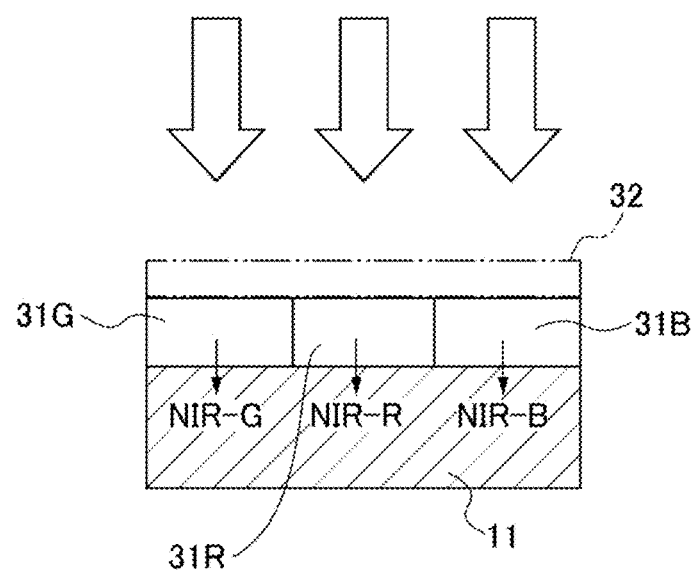

First of all, a solid-state imaging element according to a first embodiment of the present invention is described. FIG. 1 is a plan view illustrating a pixel arrangement example of a solid-state imaging element in the present embodiment, and FIG. 2 is a sectional view illustrating a schematic configuration of a pixel portion. As illustrated in FIG. 1, a solid-state imaging element 1 in the present embodiment includes a visible light detection area 2 for detecting visible light, and a near infrared light detection area 3 for detecting near infrared light.

[Visible Light Detection Area 2]

Pixels of three types having different detection wavelengths are provided in the visible light detection area 2. When pixels of three types provided in the visible light detection area 2 are respectively referred to as a "first visible light pixel", a "second visible light pixel", and a "third visible light pixel", for example, it is possible to configure such that red light R is detected by the first visible light pixel, green light G is detected by the second visible light pixel, and blue light B is detected by the third visible light pixel.

In this case, as illustrated in FIG. 2a, each pixel in the visible light detection area 2 may be configured such that a red light filter 21R for reflecting and/or absorbing visible light other than red light R, a green light filter 21G for reflecting and/or absorbing visible light other than green light G, and a blue light filter 21B for reflecting and/or absorbing visible light other than blue light B are provided on a photoelectric conversion layer 11 for detecting incident light as an electrical signal.

The photoelectric conversion layer 11 detects incident light as an electrical signal, and is configured such that a plurality of photoelectric conversion portions are formed on a substrate such as silicon. A structure of the photoelectric conversion layer 11 is not specifically limited. It is possible to employ a CCD (Charge Coupled Device) structure, a CMOS (Complementary Metal Oxide Semiconductor) structure, and the like. Further, the red light filter 21R, the green light filter 21G, and the blue light filter 21B are respectively formed on associated photoelectric conversion portions.

An infrared cut filter 22 for reflecting and/or absorbing infrared light may be provided on each pixel of the visible light detection area 2. The infrared cut filter 22 may be integrally formed on each pixel, or may be formed as a separate member. Further, an on-chip lens, a flattening layer, or the like may be provided on each pixel of the visible light detection area 2.

Note that a transmittance wavelength of each color filter provided on the photoelectric conversion layer 11 is not limited to the above-described red light R, green light G, and blue light B, and may be selected as necessary depending on a specification of a solid-state imaging element, and the like. Further, a material forming each color filter is also not specifically limited, and a well-known material may be used.

[Near Infrared Light Detection Area 3]

Pixels of three types having different detection wavelengths are also provided in the near infrared light detection area 3. When pixels of three types provided in the near infrared light detection area 3 are respectively referred to as a "first near infrared pixel", a "second near infrared pixel", and a "third near infrared pixel", for example, it is possible to configure such that light (hereinafter, referred to as near infrared light NIR-R) in a near infrared range and having a correlation with red light R on the first near infrared pixel is detected, light (hereinafter, referred to as near infrared light NIR-G) in a near infrared range and having a correlation with green light G on the second near infrared pixel is detected, and light (hereinafter, referred to as near infrared light NIR-B) in a near infrared range and having a correlation with blue light B on the third near infrared pixel is detected.

Herein, for example, near infrared light NIR-R is light of any wavelength in a range from 700 to 830 nm, near infrared light NIR-G is light of any wavelength in a range from 880 to 1200 nm, and near infrared light NIR-B is light of any wavelength in a range from 830 to 880 nm; and these near infrared light rays are respectively light rays of different wavelengths.

As illustrated in FIG. 2b, each pixel in the near infrared light detection area 3 may be configured such that an interference filter 31R for selectively transmitting near infrared light NIR-R, an interference filter 31G for selectively transmitting near infrared light NIR-G, and an interference filter 31B for selectively transmitting near infrared light NIR-B are provided on the photoelectric conversion layer 11. Characteristics of these interference filters are not specifically limited. However, for example, the interference filter 31R may be a short-pass filter in which a transmittance of near infrared light of a wavelength longer than 800 nm is 50% or less, the interference filter 31G may be a band-pass filter having a center wavelength of 850 nm, and the interference filter 31B may be a long-pass filter in which a transmittance of near infrared light of a wavelength shorter than 890 nm is 50% or less.

Further, although a configuration of the interference filters 31R, 31G, and 31B is not specifically limited, the interference filters 31R, 31G, and 31B may be configured such that dielectric layers of two types having different refractive indexes are alternately formed. FIGS. 3a to 3c are diagrammatic illustrations illustrating a configuration example of the interference filters 31R, 31G, and 31B, and FIG. 4 is a diagram illustrating characteristics of the interference filters 31R, 31G, and 31B. As illustrated in FIGS. 3a to 3c, each of the interference filters 31R, 31G, and 31B is such that low refractive index layers $31L_1$ to $31L_4$ made of a dielectric material, and high refractive index layers $31H_1$ to $31H_5$ made of a dielectric material having a refractive index higher than refractive indexes of the low refractive index layers $31L_1$ to $31L_4$ are formed on the photoelectric conversion layer 11.

The low refractive index layers $31L_1$ to $31L_4$ may be made of silicon dioxide ($SiO_2$), for example, and the high refractive index layers $31H_1$ to $31H_5$ may be made of titanium oxide ($TiO_2$), niobium pentoxide ($Nb_2O_5$), silicon nitride ($Si_3N_4$), for example.

Each of the interference filters 31R, 31G, and 31B is such that thicknesses of the low refractive index layers $31L_1$ to $31L_4$, and of the high refractive index layers $31H_1$, $31H_2$, $31H_4$, and $31H_5$ located on a light incident side and a light exit side are the same among interference filters, and only a thickness of the high refractive index layer $31H_3$ at an intermediate position in the thickness direction differs from one another. Further, for example, when it is assumed that a reference wavelength is $\lambda_0$, a refractive index of a dielectric material forming a low refractive index layer is $n_L$, and a refractive index of a dielectric material forming a high refractive index layer is $n_H$, a film thickness of the low refractive index layers $31L_1$ to $31L_4$ of the interference filters 31R, 31G, and 31B is $\lambda_0/(4 \times n_L)$, and a film thickness of the high refractive index layers $31H_1$, $31H_2$, $31H_4$, and $31H_5$ is $\lambda_0/(4 \times n_H)$.

Further, a film thickness of the high refractive index layer $31H_3$ located at an intermediate position is, for example, $1.74 \times \lambda_0/(4 \times n_H)$ in a case of the interference filter 31R, $2 \times \lambda_0/(4 \times n_H)$ in a case of the interference filter 31B, and $2.21 \times \lambda_0/(4 \times n_H)$ in a case of the interference filter 31G. In the interference filters 31R, 31G, and 31B illustrated in FIGS. 3a to 3c, by changing a thickness of the high refractive index layer $31H_3$ located at a center in the thickness direction, it is possible to change a transmittance wavelength. Further, since layers other than an intermediate layer are the same among interference filters, it is possible to simplify a manufacturing process.

Figure 3:
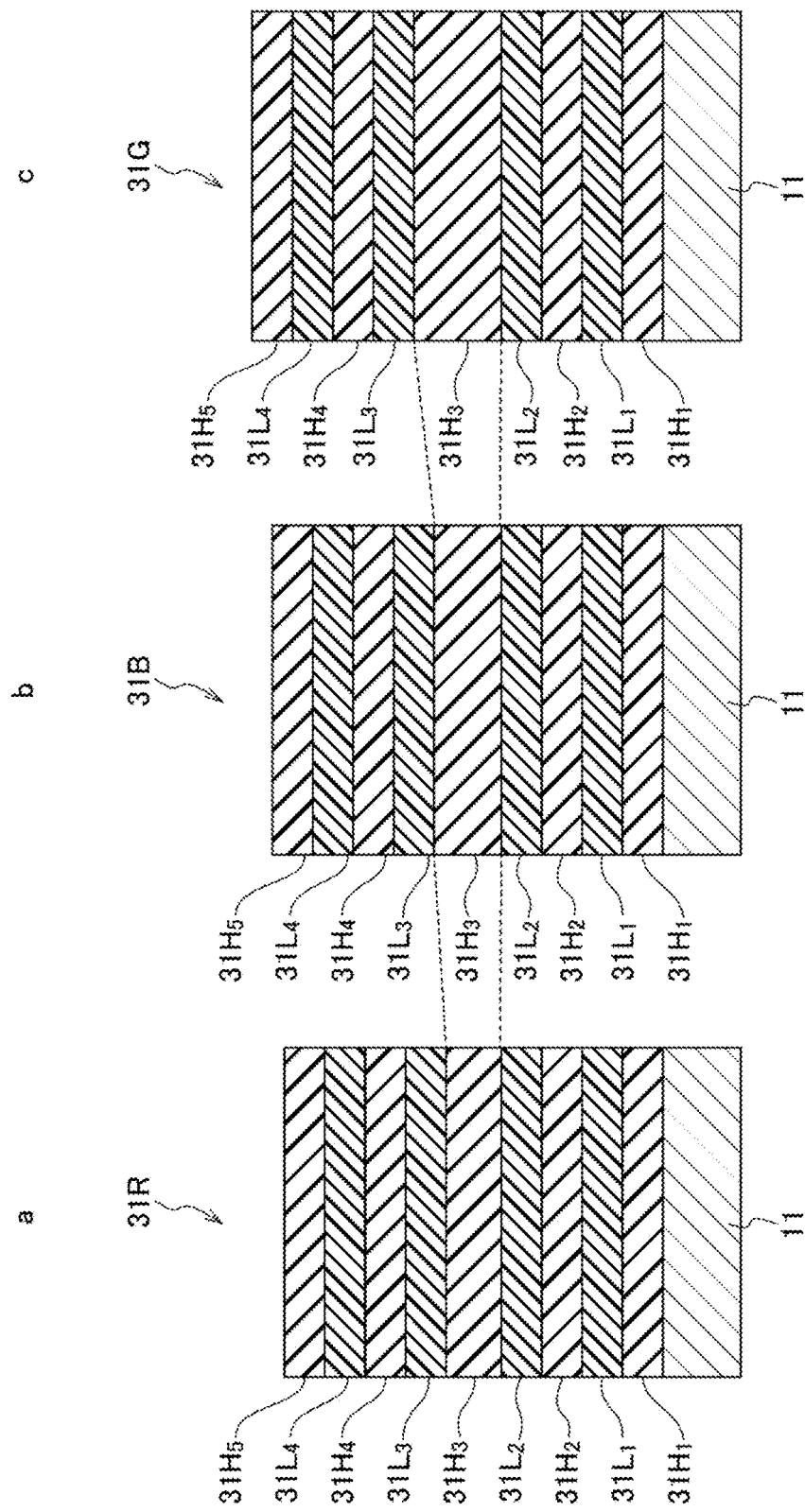
FIGS. 3a to 3c are diagrammatic illustrations illustrating a configuration example of interference filters illustrated in FIG. 2, wherein a illustrates an interference filter 31R, b illustrates an interference filter 31B, and c illustrates an interference filter 31G.
Figure 4:
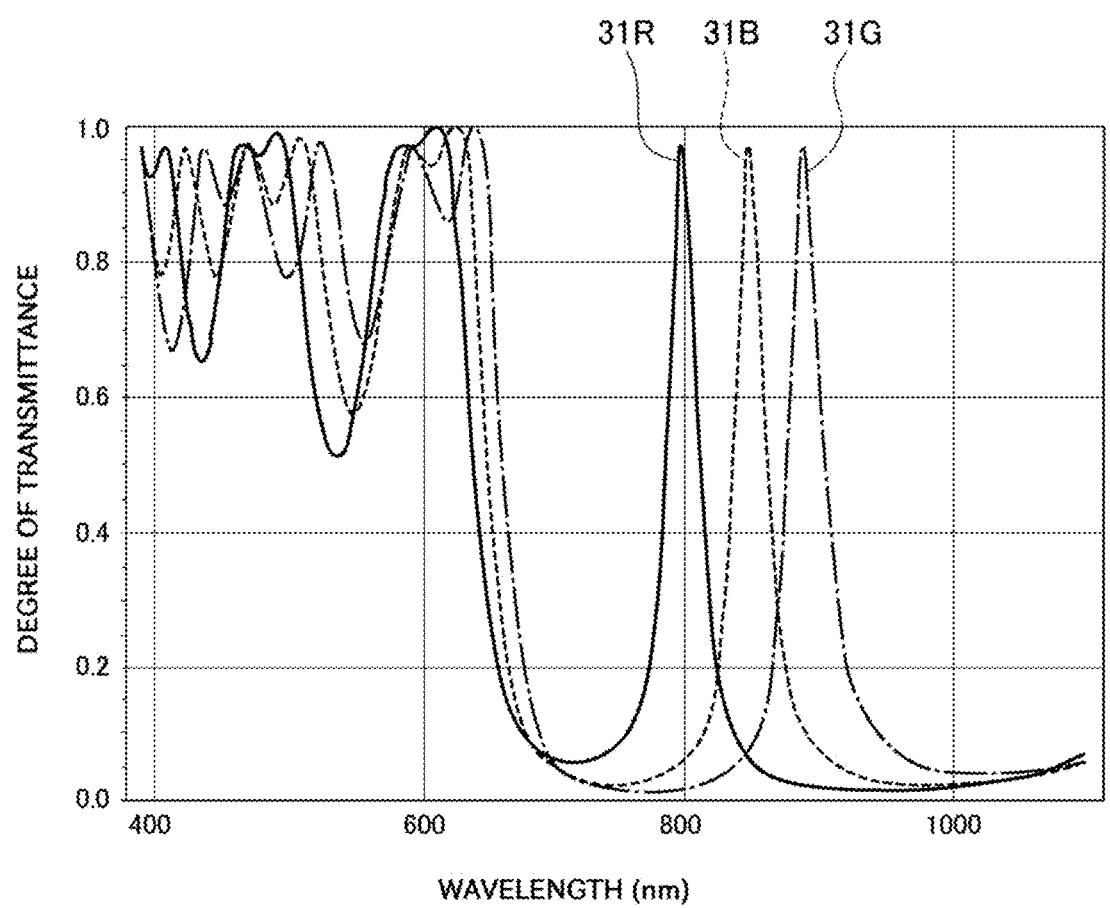
FIG. 4 is a diagram illustrating characteristics of the interference filters 31R, 31G, and 31B having the configuration illustrated in FIG. 3.

Further, when interference filters having the configuration illustrated in FIG. 3 are formed by setting the reference wavelength $\lambda_0$ to 850 nm, as illustrated in FIG. 4, it is possible to obtain the interference filters 31R, 31G, and 31B for respectively and selectively transmitting near infrared light NIR-R, near infrared light NIR-G, and near infrared light NIR-B.

Figure 5:
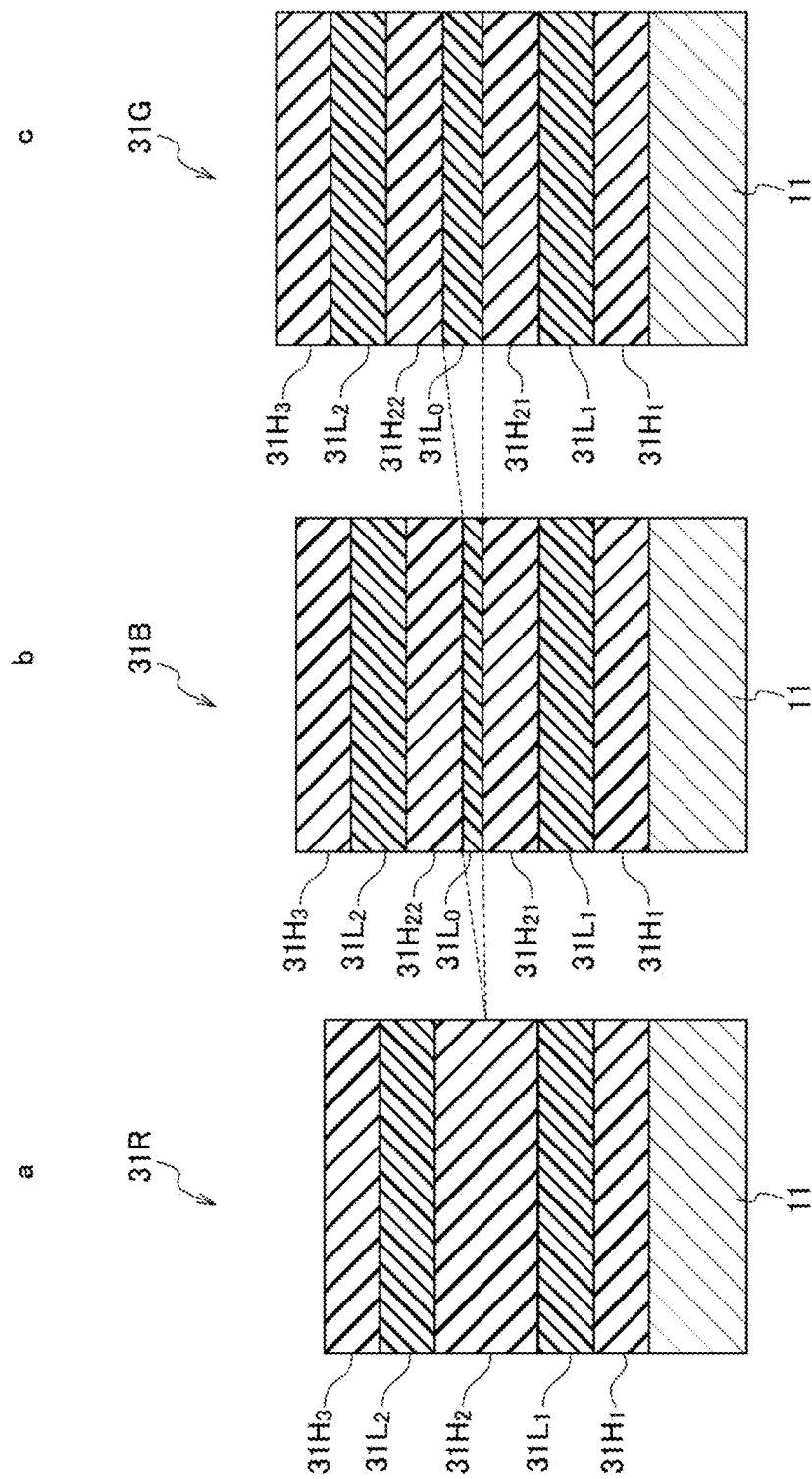
FIGS. 5a to 5c are diagrammatic illustrations illustrating a configuration example of interference filters illustrated in FIG. 2, wherein a illustrates an interference filter 31R, b illustrates an interference filter 31B, and c illustrates an interference filter 31G.
Figure 6:
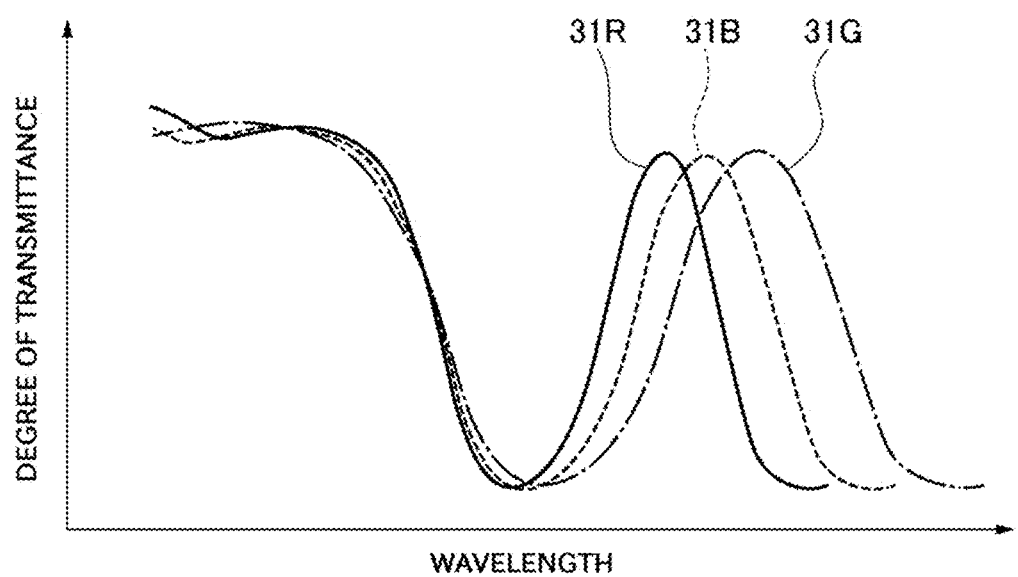
FIG. 6 is a diagram illustrating characteristics of the interference filters 31R, 31G, and 31B having the configuration illustrated in FIG. 5.

FIGS. 5a to 5c are diagrammatic illustrations illustrating another configuration example of the interference filters 31R, 31G, and 31B, and FIG. 6 is a diagram illustrating characteristics thereof. The interference filters 31R, 31G, and 31B are not limited to the above-described configurations illustrated in FIGS. 3a to 3c. For example, as illustrated in FIGS. 5a to 5c, it is possible to change a transmittance wavelength by providing a low refractive index layer $31L_0$ as a spacer at an intermediate position in the thickness direction, and changing a thickness of the low refractive index layer $31L_0$.

In this case, for example, as illustrated in FIG. 5a, in the interference filter 31R, a low refractive index layer $31L_0$ is not formed, and a high refractive index layer $31H_2$ of a thickness two times as thick as high refractive index layers $31H_1$ and $31H_3$ is formed as an intermediate layer. Meanwhile, in each of the interference filters 31B and 31G, a high refractive index layer $31H_2$ is divided into a high refractive index layer $31H_{21}$ and a high refractive index layer $31H_{22}$, and a low refractive index layer $31L_0$ is formed between the high refractive index layers $31H_{21}$ and $31H_{22}$. In this case, a thickness of the low refractive index layer $31L_0$ is large in the interference filter 31G, as compared with the interference filter 31B.

Also in the interference filters 31R, 31G, and 31B illustrated in FIGS. 5a to 5c, the high refractive index layers $31H_1$ and $31H_3$, and the low refractive index layers $31L_1$ and $31L_2$ other than an intermediate layer are the same among interference filters. Further, as illustrated in FIG. 6, as compared with the configurations illustrated in FIGS. 3a to 3c, the interference filters 31R, 31G, and 31B are able to suppress variation in characteristics among filters.

Note that the number of layers for each layer in the interference filters 31R, 31G, and 31B is not specifically limited. However, preferably, the number of high refractive index layers may be three or more, and the total number of high refractive index layers may be five or more, more preferably, the number of layers for each layer may be five or more, and further preferably, the number of layers for each layer may be ten or more. According to this configuration, it is possible to make frequency characteristics of each interference filter sharp.

Meanwhile, in order to eliminate an influence of visible light and accurately detect near infrared light, a visible light cut filter 32 for reflecting and/or absorbing visible light may be provided on each pixel of the near infrared light detection area 3. The visible light cut filter 32 may be integrally formed on each pixel, or may be formed as a separate member. Further, an on-chip lens, a flattening layer, or the like may be provided on each pixel of the near infrared light detection area 3.

Further, the red light filter 21R, the green light filter 21G, the blue light filter 21B, or another color filter may be provided on a layer upper or lower than the interference filters 31R, 31G, and 31B on each pixel of the near infrared light detection area 3. In this case, it is desirable to form the interference filters 31R, 31G, and 31B on a layer upper than the red color filter 21R, the green light filter 21G, and the blue light filter 21B. According to this configuration, it is possible to suppress incidence of light in an oblique direction onto another pixel.

[Operation]

Next, an operation of a solid-state imaging element in the present embodiment is described. The solid-state imaging element 1 in the present embodiment detects visible light on each pixel of the visible light detection area 2, and detects near infrared light on each pixel of the near infrared light detection area 3. Specifically, as illustrated in FIG. 2a, visible light (R, G, and B) in a specific wavelength band, which is transmitted through the color filters 21R, 21G, and 21B disposed on each photoelectric conversion portion of the visible light detection area 2, is incident on each photoelectric conversion portion. Further, an electrical signal associated with an intensity of visible light (R, G, and B) in a wavelength band, which is transmitted through the color filters 21R, 21G, and 21B, is output from each photoelectric conversion portion. Thus, it is possible to obtain a color image derived from visible light.

On the other hand, as illustrated in FIG. 2b, near infrared light in a specific wavelength band, which is transmitted through the interference filters 31R, 31G, and 31B disposed on each photoelectric conversion portion of the near infrared light detection area 3, is incident on each photoelectric conversion portion. Further, an electrical signal associated with an intensity of near infrared light (NIR-R, NIR-G, and NIR-B) in a wavelength band, which is transmitted through the interference filters 31R, 31G, and 31B, is output from each photoelectric conversion portion. Herein, since near infrared light NIR-R, near infrared light NIR-G, and near infrared light NIR-B have a correlation with red light R, green light G, and blue light B, it is possible to form a color image equivalent to visible light detection by using signals derived from these light rays.

A solid-state imaging element in the present embodiment may perform detection by using either the visible light detection area 2 or the near infrared light detection area 3. For example, during daytime, visible light may be detected by operating only each pixel of the visible light detection area 2 or using only a signal from each photoelectric conversion portion of the visible light detection area 2; and during nighttime, near infrared light may be detected by operating only each pixel of the near infrared light detection area 3 or using only a signal from each photoelectric conversion portion of the near infrared light detection area 3.

Alternatively, it is possible to perform detection by always using both pixels of the visible light detection area 2 and pixels of the near infrared light detection area 3. In this case, for example, during daytime, it is possible to eliminate an influence of a near infrared light component by correcting respective signals of red light R, green light G, and blue light B detected in the visible light detection area 2 with use of signals of near infrared light NIR-R, near infrared light NIR-G, and near infrared light NIR-B detected in the near infrared light detection area 3.

On the other hand, during nighttime, it is possible to eliminate an influence of a visible light component included in ambient light such as headlight by correcting signals of near infrared light NIR-R, near infrared light NIR-G, and near infrared light NIR-B detected in the near infrared light detection area 3 with use of respective signals of red light R, green light G, and blue light B detected in the visible light detection area 2. Consequently, it is possible to improve detection accuracy of visible light and near infrared light, and enhance color reproducibility in color photography.

As described above in detail, a solid-state imaging element in the present embodiment detects red light R, green light G, and blue light B; and near infrared light NIR-R, near infrared light NIR-G, and near infrared light NIR-B having a correlation with these light rays by providing a visible light detection area and a near infrared light detection area, and providing pixels of three types having different detection wavelengths in each area. Therefore, it is possible to photograph a color image in an illumination environment of a wide range from normal illumination to darkness (zero lux).

Further, since a solid-state imaging element in the present embodiment performs detection by different pixels for each wavelength, it is easy to design each pixel, and a film configuration can be made simple. Therefore, it is possible to easily manufacture a solid-state imaging element, as compared with a conventional product. Further, a configuration of a solid-state imaging element in the present embodiment is applicable to both a back-side illumination type and a front-side illumination type. However, a back-side illumination type in which an influence of reflection light is small is suitable.

Modification of First Embodiment

Next, a solid-state imaging element according to a modification of the first embodiment of the present invention is described. FIG. 7 is a plan view illustrating a pixel arrangement example of a solid-state imaging element in the present modification. In the solid-state imaging element 1 illustrated in FIG. 1, the visible light detection area 2 and the near infrared light detection area 3 are alternately formed every other four pixels. The present invention, however, is not limited to the above. A visible light detection area and a near infrared light detection area may be formed with any arrangement.

For example, like a solid-state imaging element as a modification illustrated in FIG. 7, a group of pixels for visible light reception may be formed in one area (visible light detection area 2), and a group of pixels for near infrared light reception may be formed in another area (near infrared light detection area 3). According to this configuration, a film forming process when a visible light cut filter is provided is made easy. Note that a configuration and advantageous effects of the present modification other than the above are similar to those in the above-described first embodiment.

Second Embodiment

Figure 8:
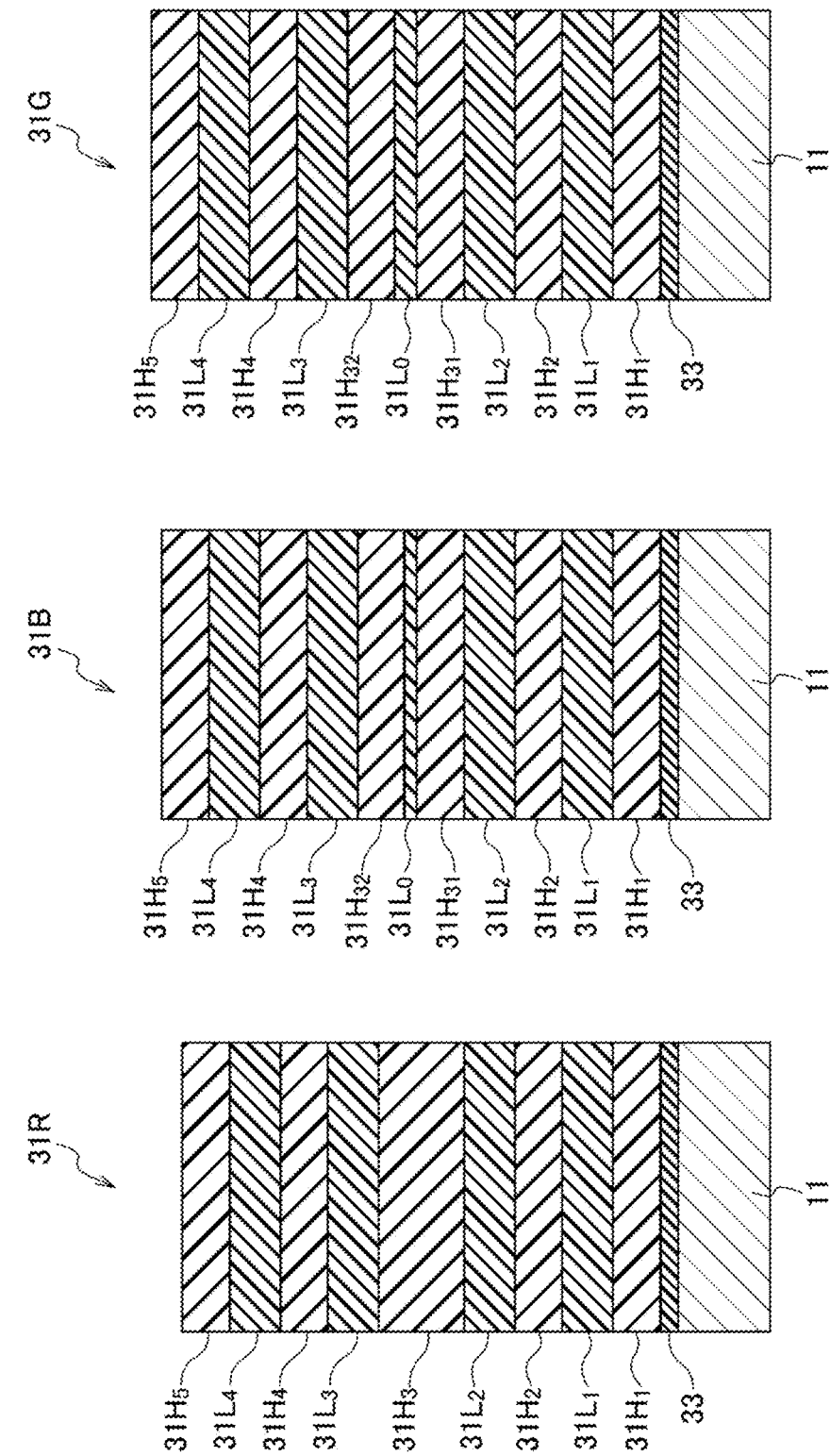
FIGS. 8a to 8c are diagrammatic illustrations illustrating a schematic configuration of a pixel portion of a solid-state imaging element in a second embodiment according to the present invention, wherein a illustrates an interference filter 31R, b illustrates an interference filter 31B, and c illustrates an interference filter 31G.

Next, a solid-state imaging element according to a second embodiment of the present invention is described. FIG. 8 is a sectional view illustrating a schematic configuration of a pixel portion of a solid-state imaging element in the present embodiment. Note that, in FIG. 8, a same configuration of each pixel as illustrated in FIG. 5 is indicated with a same reference number, and detailed description thereof is omitted. As illustrated in FIG. 8, an antireflection film 33 is formed on each pixel of a near infrared light detection area 3 of a solid-state imaging element 20 in the present embodiment.

[Antireflection Film 33]

The antireflection film 33 prevents reflection on a boundary surface between interference filters 31R, 31G, and 31B; and another member or another layer, and is laminated on a light-exit-side outermost layer of each of the interference filters 31R, 31G, and 31B. Specifically, in the solid-state imaging element 20 in the present embodiment, the interference filters 31R, 31G, and 31B are formed on the antireflection film 33.

The antireflection film 33 is made of a material having a refractive index from 1.5 to 2.5, preferably, from 1.9 to 2.1. The antireflection film 33 may be made of SiN, C, SiON, Ni, silver chloride, or the like, but is not limited to these materials. As far as a refractive index falls in the above-described range, the antireflection film 33 may be made of any other material. Further, although a thickness of the antireflection film 33 is not specifically limited, the thickness is from 5 to 1000 nm, for example.

Like the solid-state imaging element 20 in the present embodiment, forming the antireflection film 33 on a light-exit-side outermost layer of an interference filter enables to suppress variation in spectral characteristics, and make transmittance characteristics sharp. In particular, it is possible to suppress occurrence of a phenomenon such that a sensitivity of light called spectral ripples fluctuates up and down. Further, when a red color filter 21R, a green color filter 21G, and a blue light filter 21B are provided between the interference filters 31R, 31G, and 31B; and a photoelectric conversion layer 11, it is preferable to form an antireflection film also on a silicon substrate in terms of improving spectral transmittance characteristics.

Note that a configuration and advantageous effects of the solid-state imaging element 20 in the present embodiment other than the above are similar to those in the above-described first embodiment.

Modification of Second Embodiment

Figure 9:
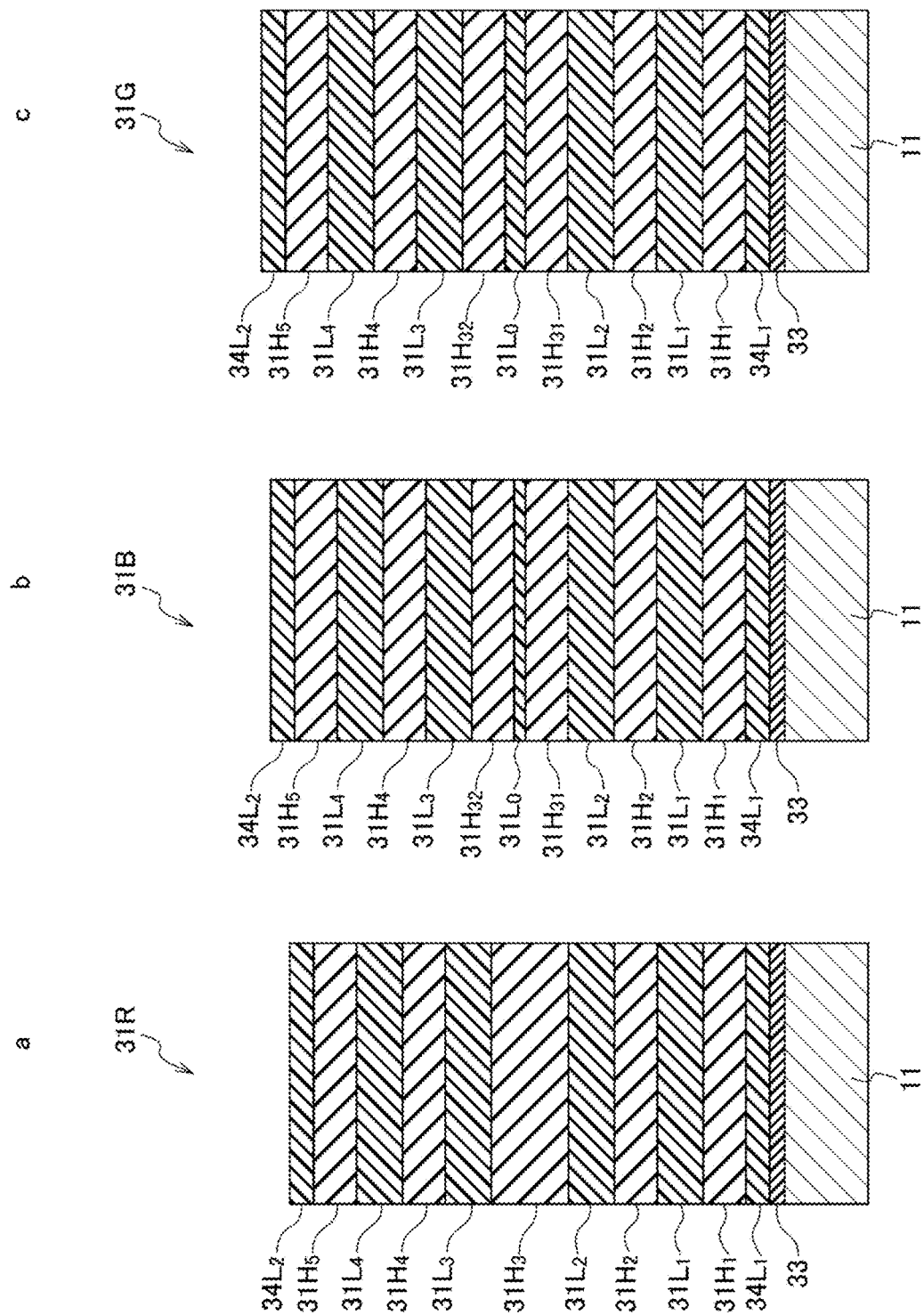
FIGS. 9a to 9c are diagrammatic illustrations illustrating a schematic configuration of a pixel portion of a solid-state imaging element as a modification of the second embodiment according to the present invention, wherein a illustrates an interference filter 31R, b illustrates an interference filter 31B, and c illustrates an interference filter 31G.

Next, a solid-state imaging element according to a modification of the second embodiment of the present invention is described. FIG. 9 is a sectional view illustrating a schematic configuration of a pixel portion of a solid-state imaging element in the present modification. Note that, in FIG. 9, a same configuration of each pixel as illustrated in FIG. 8 is indicated with a same reference number, and detailed description thereof is omitted.

As illustrated in FIG. 9, a solid-state imaging element 30 in the present modification is configured such that low refractive index layers $34L_1$ and $34L_2$ made of a dielectric material having a refractive index lower than refractive indexes of high refractive index layers $31H_1$ to $31H_5$ are respectively laminated on a light-incident-side outermost layer and a light-exit-side outermost layer of each of interference filters 31R, 31G, and 31B; and an antireflection layer 33 is laminated on the low refractive index layer $34L_1$ of the light-exit-side outermost layer. Note that the low refractive index layers $34L_1$ and $34L_2$ may be formed on at least one of a light-incident-side outermost layer and a light-exit-side outermost layer of each of the interference filters 31R, 31G, and 31B.

The low refractive index layers $34L_1$ and $34L_2$ may be made of a same material as the above-described low refractive index layers $31L_1$ to $31L_4$, for example. Further, thicknesses of the low refractive index layers $34L_1$ and $34L_2$ may differ from each other, and may further differ from thicknesses of the low refractive index layers $31L_1$ to $31L_4$. For example, in a case where a thickness of the low refractive index layer $34L_2$ located on a light-incident-side outermost layer is made smaller than a thickness of the low refractive index layer $34L_1$ located on a light-exit-side outermost layer, when a thickness of the low refractive index layers $31L_1$ to $31L_4$ is $\lambda_0/(4 \times n_L)$, it is possible to set a thickness of the low refractive index layer $34L_1$ to $1.2 \times \lambda_0/(4 \times n_L)$, and a thickness of the low refractive index layer $34L2$ to $0.5 \times \lambda_0/(4 \times n_L)$.

In a solid-state imaging element in the present modification, the antireflection film 33 is formed on each pixel, and the low refractive index layers $34L_1$ and $34L_2$ having thicknesses different from each other are formed on a light-incident-side outermost layer and/or a light-exit-side outermost layer of each of the interference filters 31R, 31G, and 31B. Therefore, it is particularly possible to remarkably improve transmittance characteristics in a visible light range.

Third Embodiment

Figure 10:
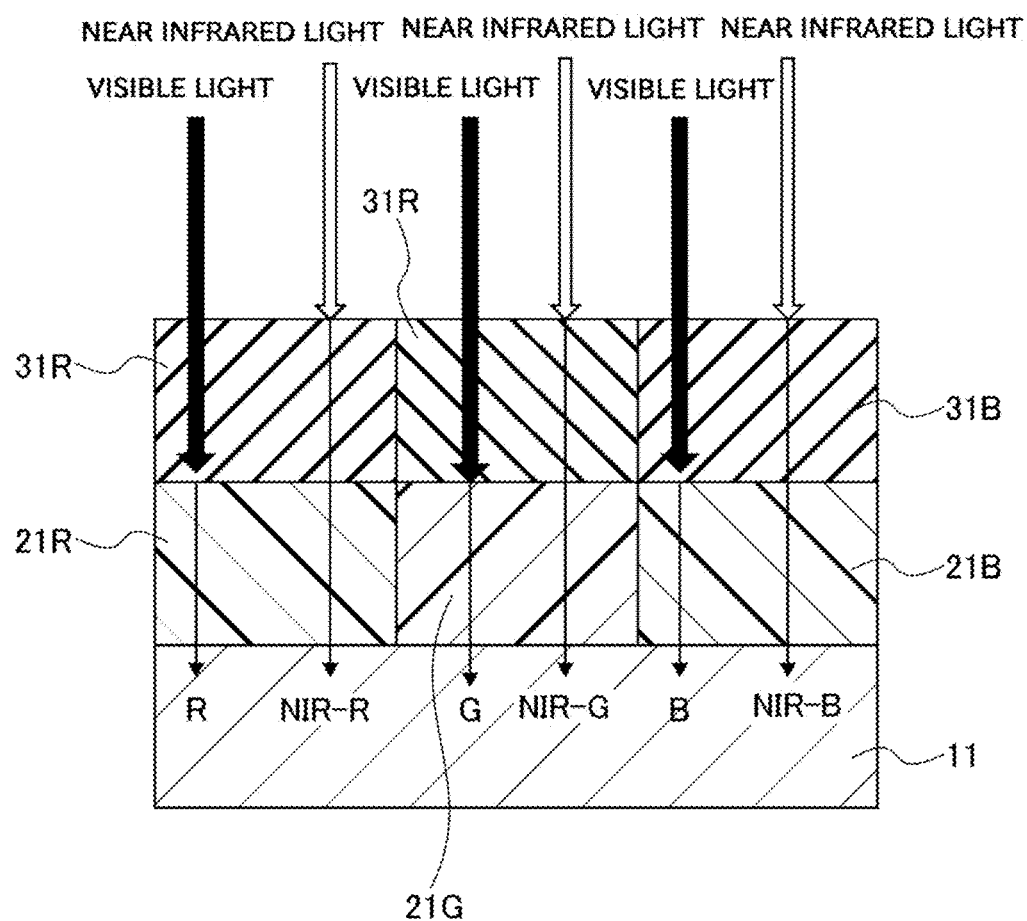
FIG. 10 is a sectional view schematically illustrating a schematic configuration of a solid-state imaging element in a third embodiment according to the present invention.

Next, a solid-state imaging element according to a third embodiment of the present invention is described. FIG. 10 is a sectional view schematically illustrating a schematic configuration of a solid-state imaging element in the present embodiment. Note that, in FIG. 10, a same configuration of each pixel as illustrated in FIG. 2 is indicated with a same reference numeral, and detailed description thereof is omitted.

In the solid-state imaging elements in the above-described first and second embodiments, a visible light detection area and a near infrared light detection area are constituted of individual pixels. The present invention, however, is not limited to the above. A part or the entirety of a visible light detection area and a near infrared light detection area may overlap each other. Specifically, a solid-state imaging element according to the present invention may include pixels for detecting both visible light and near infrared light.

As illustrated in FIG. 10, in a solid-state imaging element 40 in the present embodiment, a first pixel for receiving first visible light, and first near infrared light having a correlation with the first visible light; a second pixel for receiving second visible light having a wavelength different from a wavelength of the first visible light, and second near infrared light having a correlation with the second visible light; and a third pixel for receiving third visible light having a wavelength different from the wavelengths of the first visible light and the second visible light, and third near infrared light having a correlation with the third visible light are provided. In this way, in the solid-state imaging element 40 in the present embodiment, pixels of three types having different detection wavelengths are provided.

For example, when it is assumed that first visible light, second visible light, and third visible light are respectively red light (R), green light (G), and blue light (B), first near infrared light, second near infrared light, and third near infrared light are light (NIR-R) in a near infrared range and having a correlation with red light, light (NIR-G) in a near infrared range and having a correlation with green light, and light (NIR-B) in a near infrared range and having a correlation with blue light. Further, for example, near infrared light NIR-R is light of any wavelength in a range from 700 to 830 nm, near infrared light NIR-G is light of any wavelength in a range from 880 to 1200 nm, and near infrared light NIR-B is light of any wavelength in a range from 830 to 880 nm; and these near infrared light rays are respectively light rays of different wavelengths.

Optical filters for respectively reflecting and/or absorbing visible light other than first visible light, second visible light, and third visible light, and an optical filter for reflecting and/or absorbing near infrared light in a specific wavelength range are laminated on a photoelectric conversion layer 11 on each pixel of the solid-state imaging element 40 in the present embodiment.

[Optical Filter]

When first visible light, second visible light, and third visible light are respectively red light (R), green light (G), and blue light (B), as illustrated in FIG. 1, a red color filter 21R for reflecting and/or absorbing visible light other than red light R, a green color filter 21G for reflecting and/or absorbing visible light other than green light G, and a blue color filter 21B for reflecting and/or absorbing visible light other than blue light B are respectively provided in an area immediately above each photoelectric conversion portion of the photoelectric conversion layer 11.

A configuration of each of the color filters 21R, 21G, and 21B is not specifically limited. It is possible to use a visible light cut filter or an interference filter for cutting visible light of a specific wavelength, in addition to a filter using an organic material having a property of absorbing a specific wavelength. Note that a transmittance wavelength of each of the color filters 21R, 21G, and 21B provided on the photoelectric conversion layer 11 is not limited to the above-described transmittance wavelengths of red light R, green light B, and blue light B, and may be selected as necessary depending on a specification of a solid-state imaging element, and the like.

Further, a near infrared cut filter for reflecting and/or absorbing near infrared light in a specific wavelength range is provided respectively together with the above-described color filters 21R, 21G, and 21B in an area immediately above each photoelectric conversion portion of the photoelectric conversion layer 11. A near infrared cut filter may be, for example, a near infrared cut filter 31R for reflecting and/or absorbing near infrared light of 750 nm or more, a near infrared cut filter 31G for reflecting and/or absorbing near infrared light from 650 nm to 900 nm, and one or more near infrared cut filters 31B for reflecting and/or absorbing near infrared light from 550 to 860 nm and/or 900 nm or more.

It is possible to implement the near infrared cut filters 31R, 31G, and 31B by an interference filter having a structure such that dielectric layers of two types having different refractive indexes as illustrated in FIG. 3, FIG. 5, FIG. 8, and FIG. 9, for example, are alternately laminated. Note that a near infrared cut filter for use in a solid-state imaging element in the present embodiment is not limited to a configuration using the above-described interference filter. As far as it is possible to cut near infrared light of a specific wavelength, it is possible to use two or more short-pass filters, a long-pass filter, and a band-pass filter in combination.

<Red Pixel>

Figure 11:
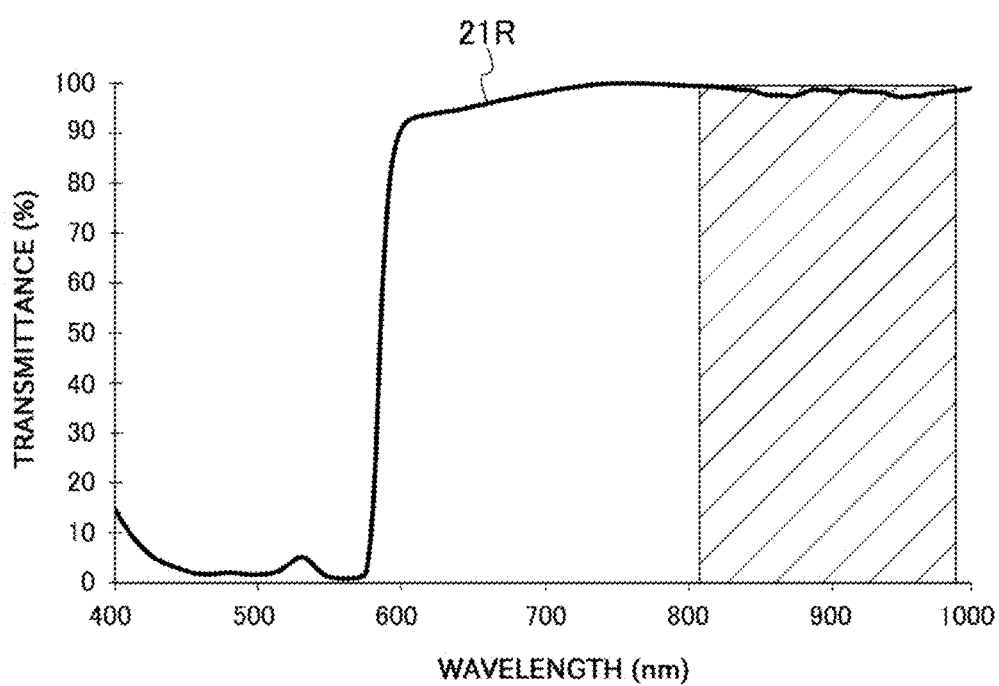
FIG. 11 is a diagram illustrating spectral transmittance characteristics of a red color filter 21R.
Figure 12:
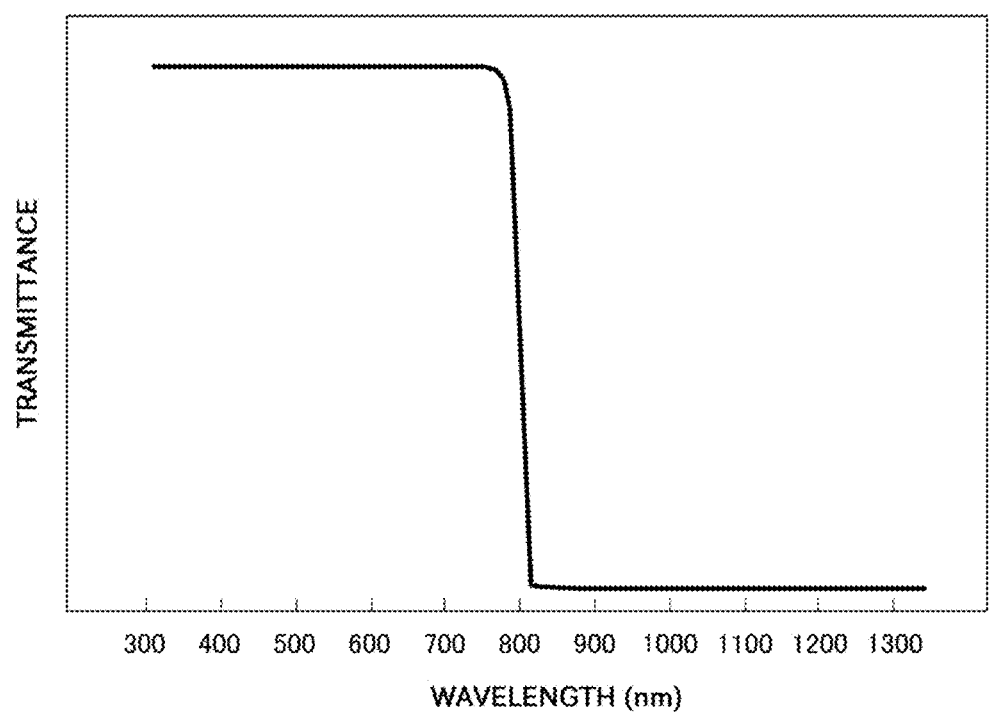
FIG. 12 is a diagram illustrating spectral transmittance characteristics of a short-pass filter for cutting near infrared light of 820 nm or more.
Figure 13:
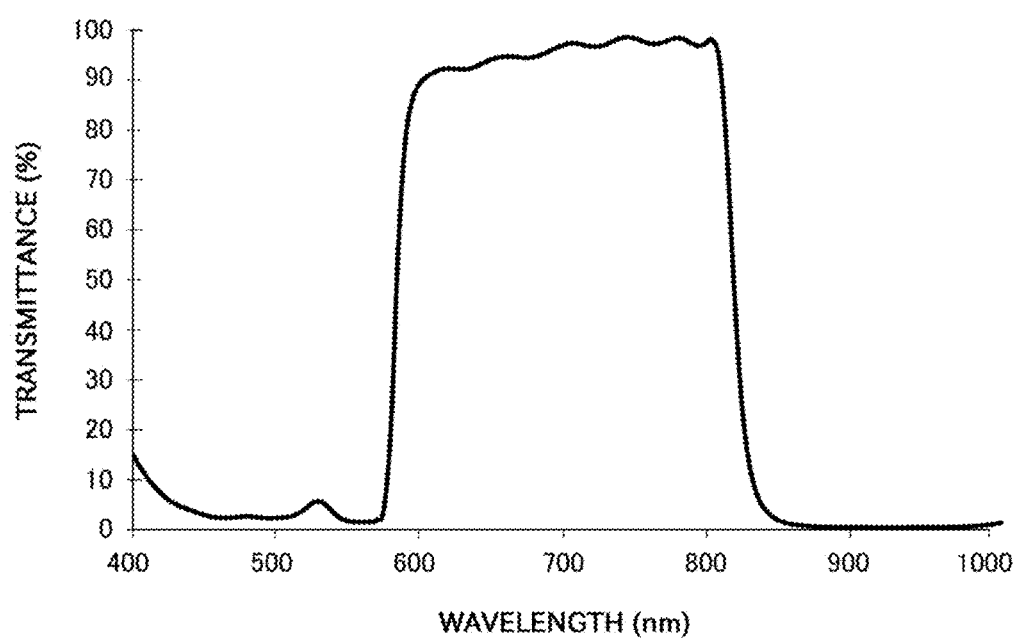
FIG. 13 is a diagram illustrating spectral characteristics, when the optical filter illustrated in FIG. 11 and the optical filter illustrated in FIG. 12 are laminated.

FIG. 11 is a diagram illustrating spectral transmittance characteristics of the red color filter 21R, FIG. 12 is a diagram illustrating spectral transmittance characteristics of a short-pass filter for cutting near infrared light of 820 nm or more, and FIG. 13 is a diagram illustrating spectral characteristics, when the optical filter illustrated in FIG. 11 and the optical filter illustrated in FIG. 12 are laminated.

For example, when the red color filter 21R has spectral transmittance characteristics illustrated in FIG. 11, a near infrared cut filter having the spectral characteristics illustrated in FIG. 12 may be laminated as the near infrared cut filter 31R. According to this configuration, spectral transmittance characteristics illustrated in FIG. 13 are obtained for a red pixel, and only red light R is incident in a visible range, and only red near infrared light NIR-R is incident in a near infrared range on a photoelectric conversion portion.

<Green Pixel>

Figure 14:
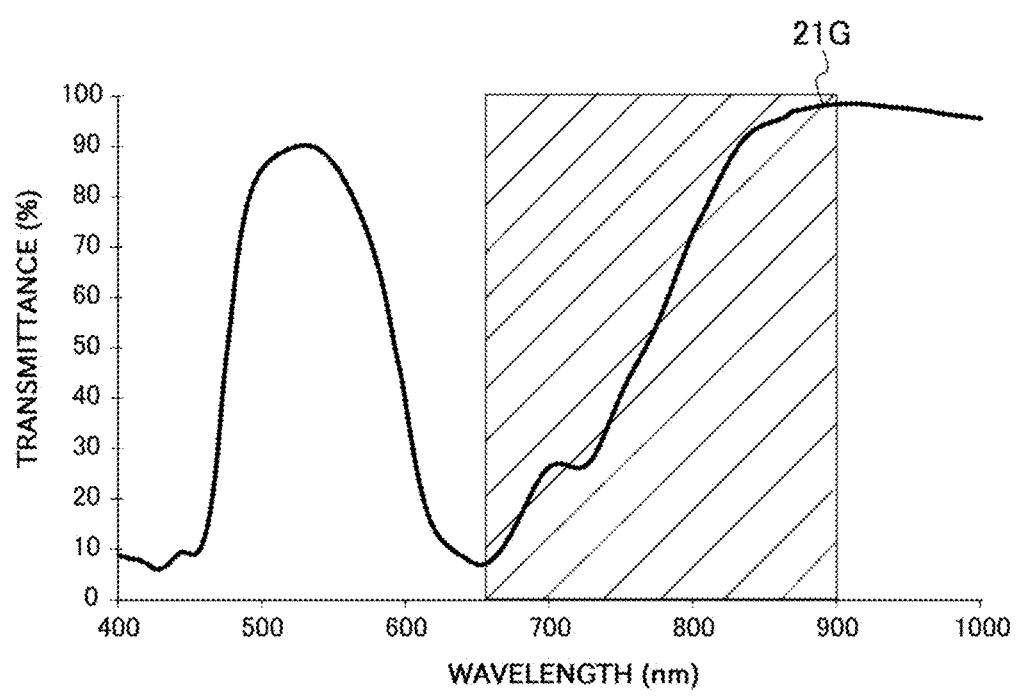
FIG. 14 is a diagram illustrating spectral transmittance characteristics of a green color filter 21G.
Figure 15:
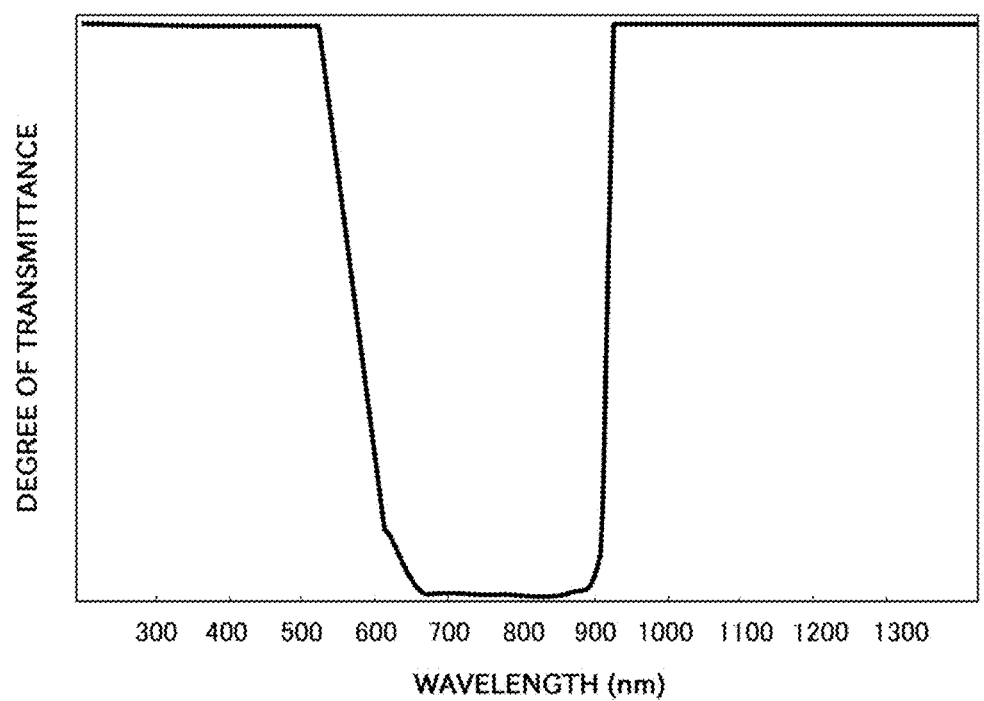
FIG. 15 is a diagram illustrating spectral transmittance characteristics of an optical filter for cutting near infrared light from 650 nm to 900 nm.
Figure 16:
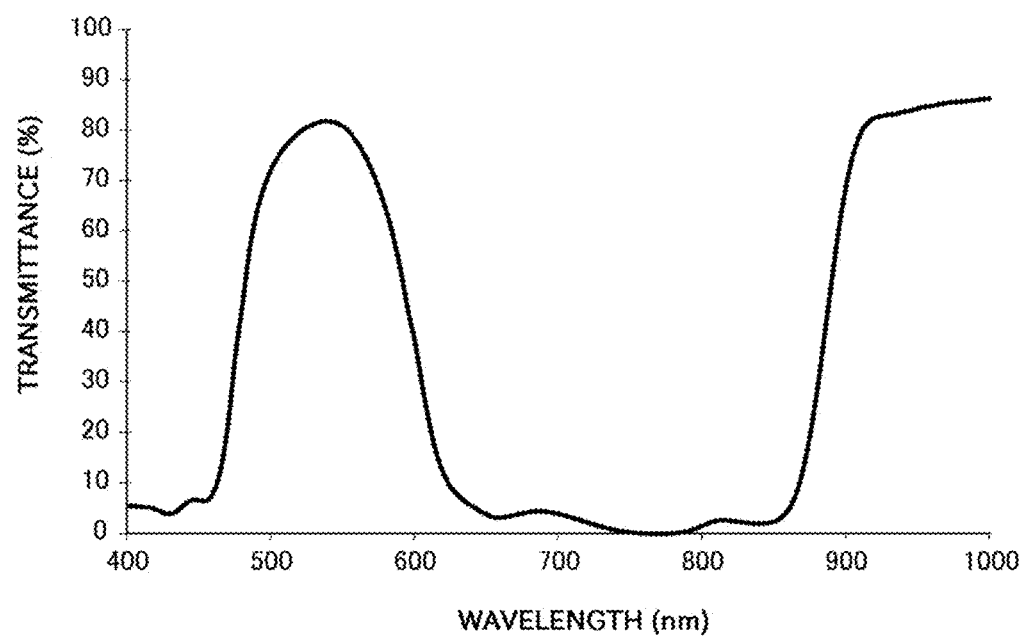
FIG. 16 is a diagram illustrating spectral transmittance characteristics, when the optical filter illustrated in FIG. 14 and the optical filter illustrated in FIG. 15 are laminated.

FIG. 14 is a diagram illustrating spectral transmittance characteristics of the green color filter 21G, FIG. 15 is a diagram illustrating spectral transmittance characteristics of an optical filter for cutting near infrared light from 650 nm to 900 nm, and FIG. 16 is a diagram illustrating spectral transmittance characteristics, when the optical filter illustrated in FIG. 14 and the optical filter illustrated in FIG. 15 are laminated.

For example, when the green color filter 21G has the spectral transmittance characteristics illustrated in FIG. 14, a near infrared cut filter having the spectral characteristics illustrated in FIG. 15 may be laminated as the near infrared cut filter 31G. According to this configuration, spectral transmittance characteristics illustrated in FIG. 16 are obtained for a green pixel, and only green light G is incident in a visible range, and only green near infrared light NIR-G is incident in a near infrared range on a photoelectric conversion portion.

<Blue Pixel>

Figure 17:
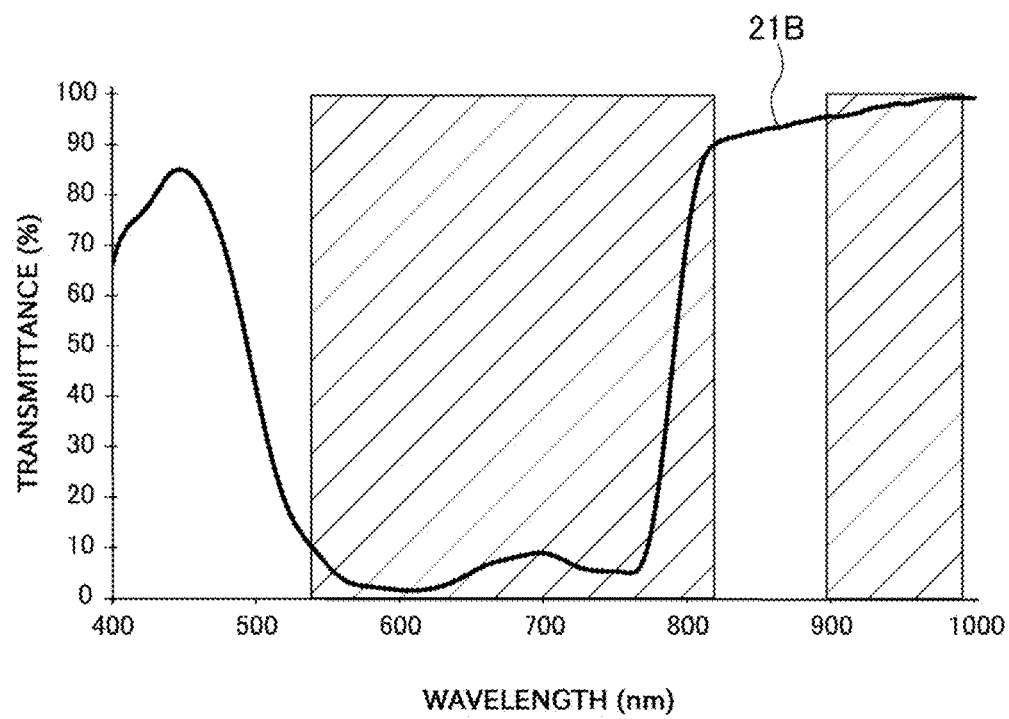
FIG. 17 is a diagram illustrating spectral transmittance characteristics of a blue color filter 21B.
Figure 18:
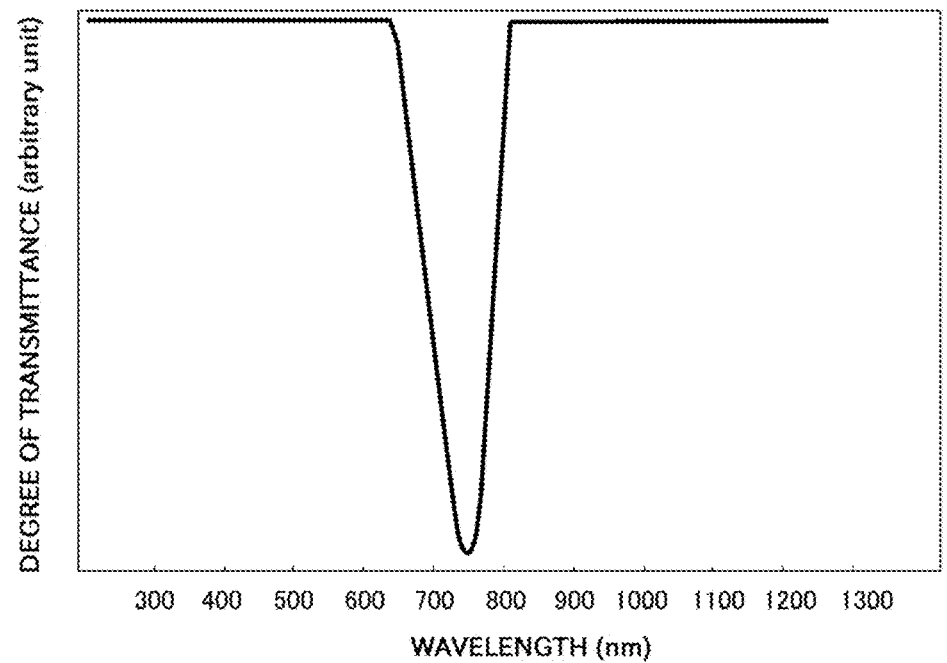
FIG. 18a is a diagram illustrating spectral transmittance characteristics of a band-pass filter having a center wavelength of 750 nm.
FIG. 18b is a diagram illustrating spectral transmittance characteristics of a short-pass filter for cutting near infrared light of 890 nm or more.
Figure 18:
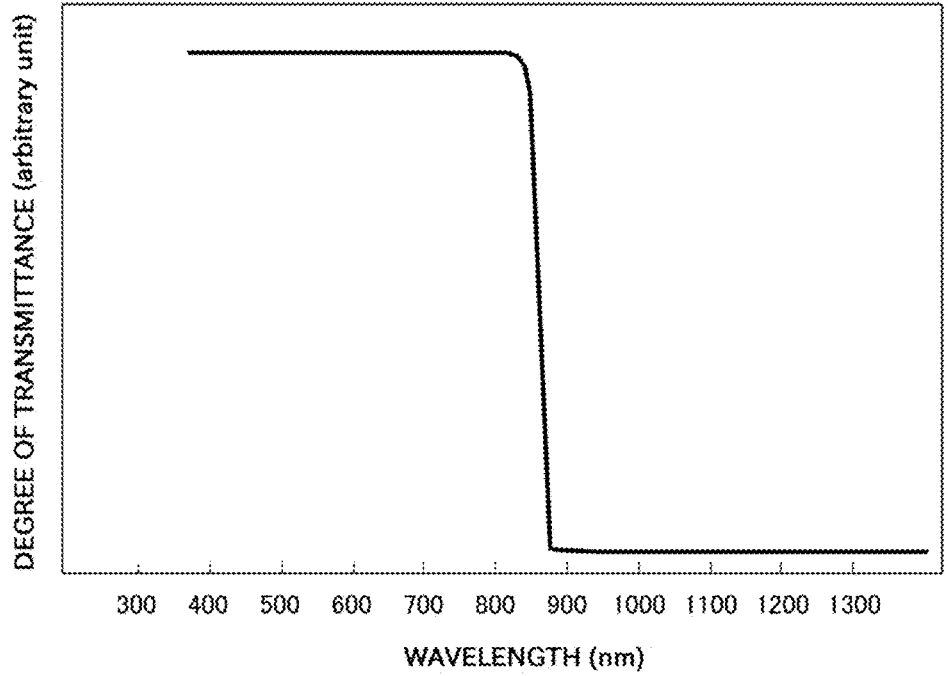
Figure 19:
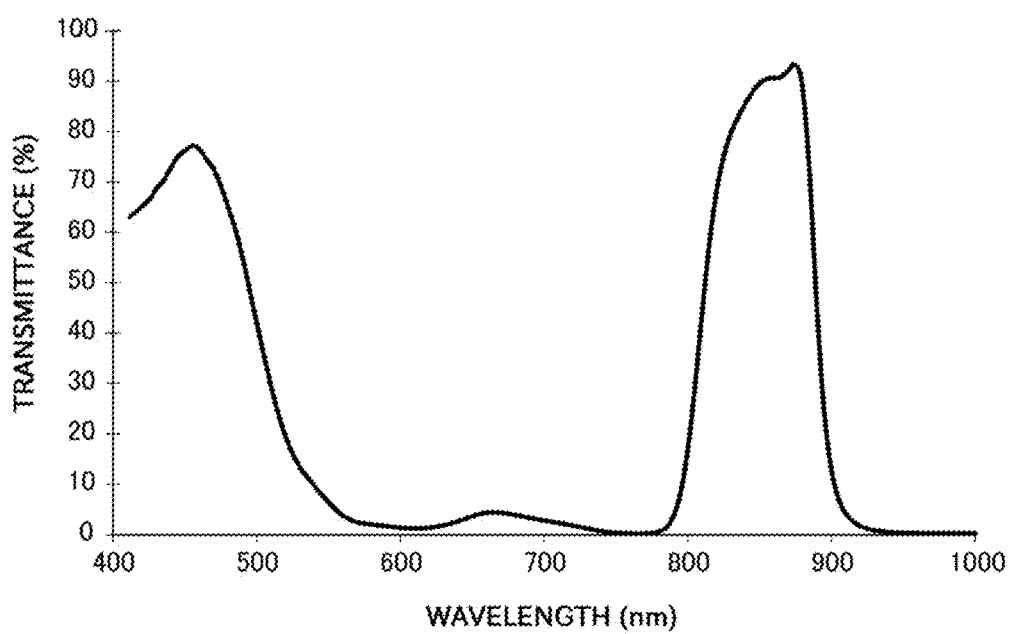
FIG. 19 is a diagram illustrating spectral transmittance characteristics, when the optical filter illustrated in FIG. 17, and the optical filters illustrated in FIGS. 18a and 18b are laminated.

FIG. 17 is a diagram illustrating spectral transmittance characteristics of the blue color filter 21B, FIG. 18a is a diagram illustrating spectral transmittance characteristics of a band-pass filter having a center wavelength of 750 nm, and FIG. 18b is a diagram illustrating spectral transmittance characteristics of a short-pass filter for cutting near infrared light of 890 nm or more. FIG. 19 is a diagram illustrating spectral transmittance characteristics, when the optical filter illustrated in FIG. 17, and the optical filters illustrated in FIGS. 18a and 18b are laminated.

For example, when the blue color filter 21B has the spectral transmittance characteristics illustrated in FIG. 17, a band-pass filter having the spectral characteristics illustrated in FIG. 18a, and a short-pass filter having the spectral characteristics illustrated in FIG. 18b may be laminated as the near infrared cut filter 31B. According to this configuration, spectral transmittance characteristics illustrated in FIG. 19 are obtained for a blue pixel, and only blue light B is incident in a visible range, and only blue near infrared light NIR-B is incident in a near infrared range on a photoelectric conversion portion.

[Optical Filter Configuration and Spectral Transmittance Characteristics]

Figure 20:
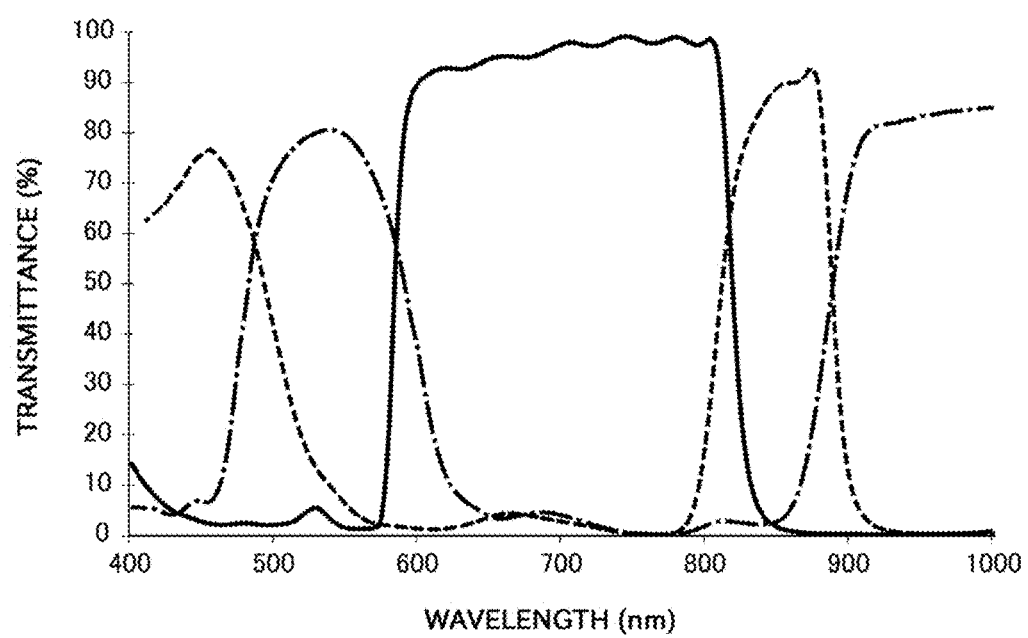
FIG. 20 is a diagram illustrating spectral transmittance characteristics of the solid-state imaging element 40 illustrated in FIG. 10.
Figure 21:
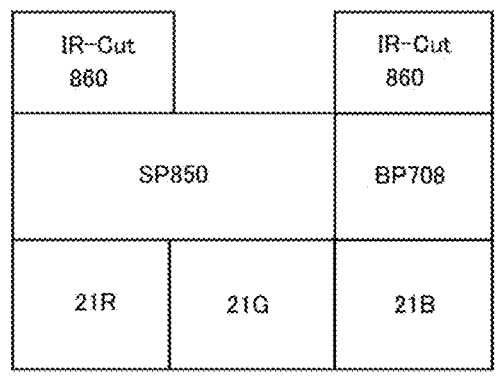
FIG. 21a is a schematic diagram illustrating a filter configuration example of a solid-state imaging element in the third embodiment according to the present invention.
FIG. 21b is a diagram illustrating spectral transmittance characteristics thereof.
Figure 21:
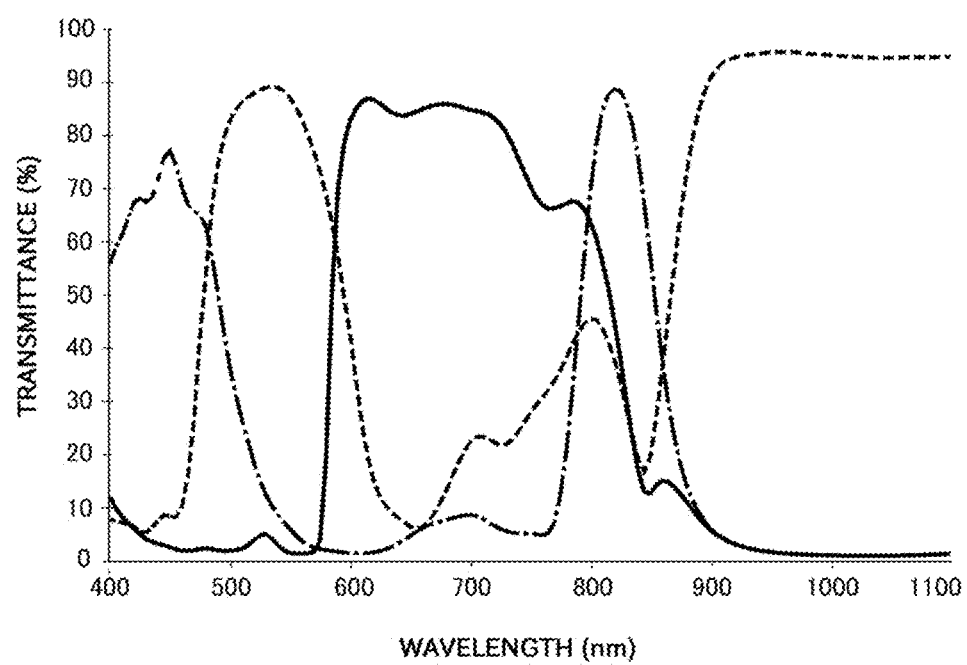
Figure 22:
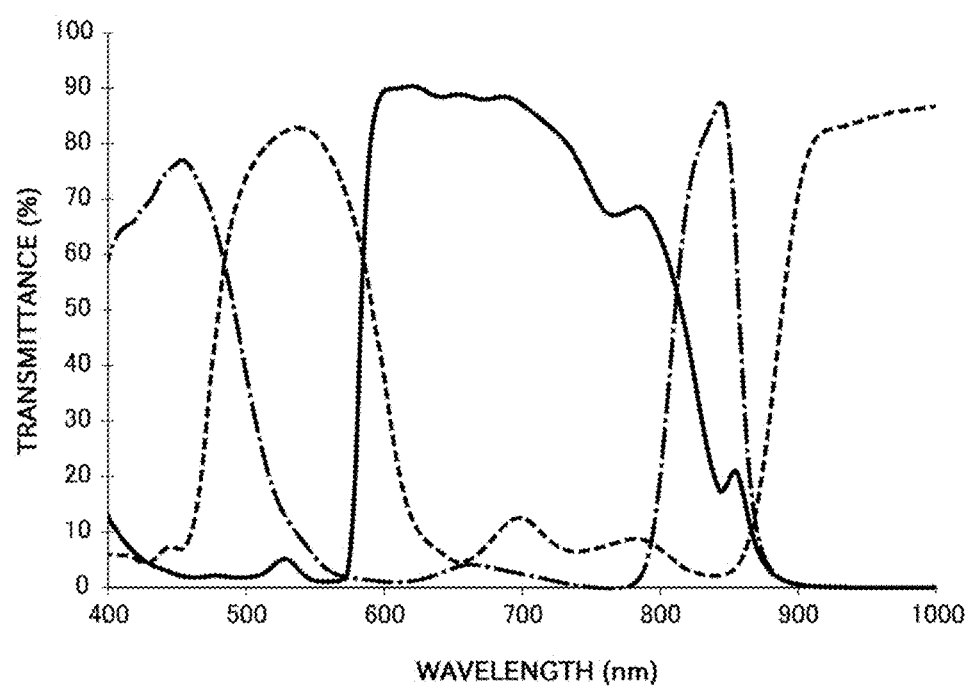
FIG. 22a is a schematic diagram illustrating another filter configuration example of the solid-state imaging element in the third embodiment according to the present invention.
FIG. 22b is a diagram illustrating spectral transmittance characteristics thereof.
Figure 23:
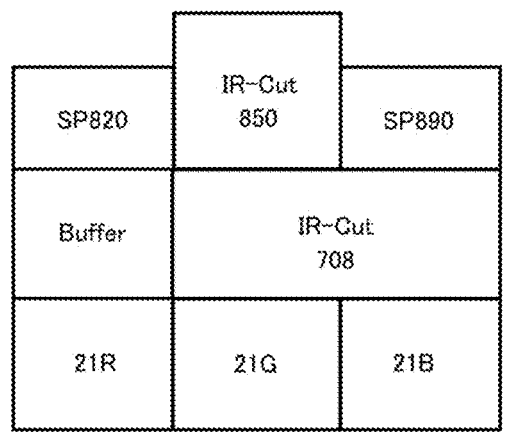
FIG. 23a is a schematic diagram illustrating another filter configuration example of the solid-state imaging element in the third embodiment according to the present invention.
FIG. 23b is a diagram illustrating spectral transmittance characteristics thereof.
Figure 23:
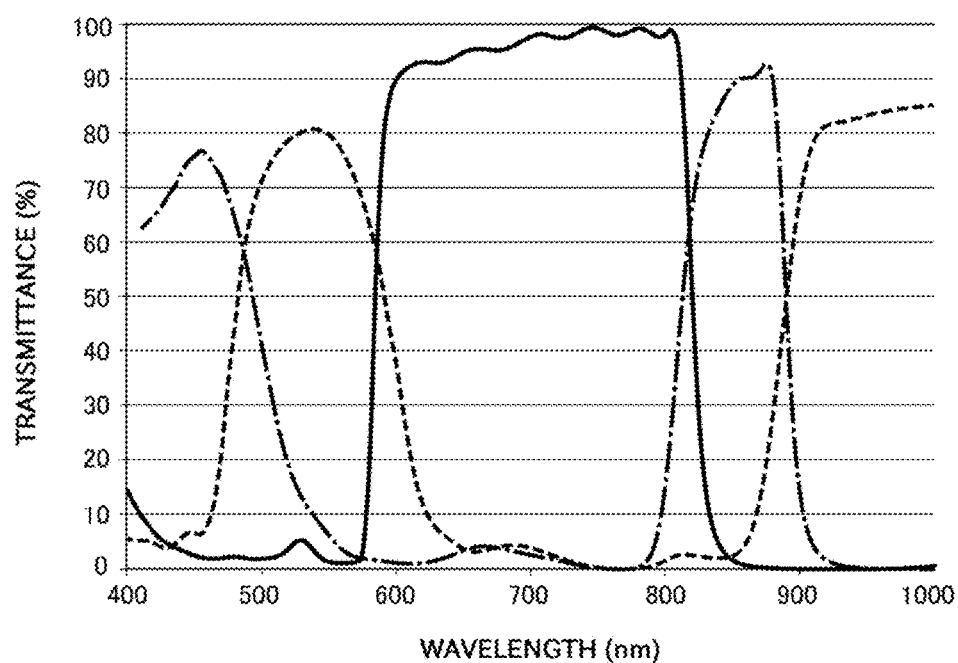

FIG. 20 is a diagram illustrating spectral transmittance characteristics of the solid-state imaging element 40 illustrated in FIG. 10, and FIGS. 21 to 23 are diagrams illustrating a filter configuration example of the solid-state imaging element 40 in the present embodiment, and spectral transmittance characteristics thereof. A solid-state imaging element constituted of a red pixel, a green pixel, and a blue pixel having the above-described spectral transmittance characteristics illustrated in FIG. 13, FIG. 16, and FIG. 19 exhibits the spectral transmittance characteristics illustrated in FIG. 20.

Further, for example, as illustrated in FIG. 21a, a near infrared cut filter for cutting light around 850 nm is laminated on the red color filter 21R and the green color filter 21G, and a near infrared cut filter for cutting light around 708 nm is laminated only on the blue color filter 21B.

Further, a near infrared cut filter for cutting near infrared light of 860 nm or more is further laminated on a red pixel and a blue pixel. For example, the above-described interference filter may be used as each of the above-described near infrared cut filters. The solid-state imaging element 40 including an optical filter having this configuration exhibits spectral transmittance characteristics illustrated in FIG. 21b.

Further, for example, as illustrated in FIG. 22a, a near infrared cut filter 31G for a green pixel may be used as an infrared cut filter for cutting light of a broader bandwidth around 850 nm. The solid-state imaging element 1 including an optical filter having this configuration exhibits spectral transmittance characteristics illustrated in FIG. 22b.

Meanwhile, as illustrated in FIG. 23a, it is possible to configure such that a near infrared cut filter for cutting light around 708 nm is laminated on the green color filter 21G and the blue color filter 21B, an infrared cut filter for cutting light of a broader bandwidth around 850 nm is laminated on a green pixel, and a near infrared cut filter for cutting near infrared light of 890 nm or more is further laminated on a blue pixel.

In this case, the red color filter 21R, and a near infrared cut filter for cutting near infrared light of 820 nm or more are laminated on a red pixel. However, a buffer layer may be formed between the near infrared cut filter and the red color filter. A solid-state imaging element 1 including an optical filter having this configuration exhibits spectral transmittance characteristics illustrated in FIG. 23b.

In FIGS. 10 to 23, a configuration example in which the near infrared cut filters 31R, 31G, and 31B are provided on the color filters 21R, 21G, and 21B is illustrated. The present invention, however, is not limited to the above. The near infrared cut filters 31R, 31G, and 31B may be formed on a lower layer, and the color filters 21R, 21G, and 21B may be formed on an upper layer. However, in view of that light in an oblique direction is less likely to be incident on other pixels, it is preferable to form the color filters 21R, 21G, and 21B on a side of the photoelectric conversion layer 11, and form the near infrared cut filters 31R, 31G, and 31B on a light incident side.

Note that, in the solid-state imaging element 40 in the present embodiment, the color filters 21R, 21G, and 21B, and the near infrared cut filters 31R, 31G, and 31B do not have to be directly laminated. A flattening layer, a buffer layer, or the like may be formed between these filters.

Further, an on-chip lens or the like may be provided on each pixel of the solid-state imaging element 1 in the present embodiment.

[Operation]

Next, an operation of the solid-state imaging element 40 in the present embodiment is described. The solid-state imaging element 40 in the present embodiment detects red light R and red near infrared light NIR-R by a red pixel, detects green light G and green near infrared light NIR-G by a green pixel, and detects blue light B and blue near infrared light NIR-B by a blue pixel. Further, an electrical signal associated with an intensity of detected light is output from each photoelectric conversion portion. Thus, a color image derived from visible light or near infrared light is obtained.

As described above in detail, a solid-state imaging element in the present embodiment has a configuration such that an optical filter for visible light and an optical filter for near infrared light are laminated. Therefore, it is possible to separate and detect red light R, green light G, and blue light B; and near infrared light NIR-R, near infrared light NIR-G, and near infrared light NIR-B having a correlation with these light rays. Since near infrared light NIR-R, near infrared light NIR-G, and near infrared light NIR-B have a correlation with red light R, green light G, and blue light B, it is possible to form a color image equivalent to visible light detection even in near infrared light detection by using signals derived from these light rays. Consequently, it is possible to photograph a color image in an illumination environment of a wide range from normal illumination to darkness (zero lux) by using a solid-state imaging element in the present embodiment.

In the present embodiment, a case where pixels of three types for detecting both visible light and near infrared light are provided is described as an example. The present invention, however, is not limited to the above. Pixels of four or more types having different detection wavelengths may be provided. Specifically, in addition to a first pixel for receiving first visible light, and first near infrared light having a correlation with the first visible light; a second pixel for receiving second visible light of a wavelength different from a wavelength of the first visible light, and second near infrared light having a correlation with the second visible light; and a third pixel for receiving third visible light of a wavelength different from the wavelengths of the first visible light and the second visible light, and third near infrared light having a correlation with the third visible light, one or more pixels (visible light pixels) for receiving one of the first visible light, the second visible light, and the third visible light may be provided.

Further, a configuration of a solid-state imaging element in the present embodiment is applicable to both a back-side illumination type and a front-side illumination type. However, a back-side illumination type in which an influence of reflection light is small is suitable. Note that a configuration and advantageous effects of a solid-state imaging element in the present embodiment other than the above are similar to those in the above-described first and second embodiments.

Fourth Embodiment

Next, a solid-state imaging element according to a fourth embodiment of the present invention is described. FIG. 24a is a diagram illustrating a pixel arrangement example of a solid-state imaging element in the present embodiment, and FIG. 24b is a diagram illustrating spectral characteristics of an optical filter provided on each pixel. In the solid-state imaging elements in the above-described first to third embodiments, near infrared light NIR-R, near infrared light NIR-G, and near infrared light NIR-B are respectively detected by individual pixels. However, a configuration in which a plurality of near infrared light rays having different wavelengths are detected by a same pixel may also be employed.

As illustrated in FIG. 24a and FIG. 24b, a solid-state imaging element 10 in the present embodiment includes a pixel for detecting red light R and red near infrared light NIR-R; a pixel for detecting green light G, and broadband light NIR-W including red near infrared light NIR-R, blue near infrared light NIR-B, and green near infrared light NIR-G; and a pixel for detecting blue light B and green near infrared light NIR-G. Further, in the solid-state imaging element 10 in the present embodiment, in addition to a pixel for receiving both visible light and near infrared light, it is also possible to provide a pixel for receiving only visible light such as green light G.

Since a pixel configuration is made simple in the solid-state imaging element 10 in the present embodiment, it is possible to reduce a manufacturing cost.

Fifth Embodiment

Next, a solid-state imaging device according to a fifth embodiment of the present invention is described. FIG. 25 is a conceptual diagram illustrating a configuration of a solid-state imaging device in the present embodiment. As illustrated in FIG. 25, a solid-state imaging device 50 in the present embodiment includes the solid-state imaging element 1 in the above-described first embodiment, and generates a color image, based on signals output from these.

The imaging device 50 in the present embodiment may include an image generation unit 43 for analyzing a signal acquired by the solid-state imaging element 1, and generating a color image by using a signal based on visible light or a signal based on near infrared light to be output from each pixel, or both of the signals. The image generation unit 43 generates a color image by using only a signal 41 based on visible light in a case of a "day mode", and generates a color image by using only a signal 42 based on near infrared light in a case of a "night mode", for example.

Further, the image generation unit 43 is also able to generate a color image by using both the signal 41 based on visible light, and the signal 42 based on near infrared light. In this case, for example, in a case of a "day mode", a color image in which an influence of a near infrared light component is eliminated is generated by correcting the signal 41 based on visible light with use of the signal 42 based on near infrared light. On the other hand, in a case of a "night mode", a color image in which an influence of a visible light component included in ambient light such as headlight is eliminated is generated by correcting the signal 42 based on near infrared light with use of the signal 41 based on visible light. Thus, it is possible to improve detection accuracy of visible light and near infrared light, and enhance color reproducibility in color photography.

An imaging device in the present embodiment includes a solid-state imaging element for detecting red light R, green light G, and blue light B; and near infrared light NIR-R, near infrared light NIR-G, and near infrared light NIR-B having a correlation with these light rays. Therefore, it is possible to photograph a color image in an illumination environment of a wide range from normal illumination to darkness (zero lux).

Note that, herein, a case where the solid-state imaging element 1 in the first embodiment is used is described as an example. The present invention, however, is not limited to the above. It is possible to perform photographing similarly by using the solid-state imaging elements in the second to fourth embodiments, and obtain similar advantageous effects.

Modification of Fifth Embodiment

Next, an imaging device according to a modification of the fifth embodiment of the present invention is described. FIG. 26 is a diagram schematically illustrating a configuration of an imaging device in the present modification. As illustrated in FIG. 26, an imaging device 51 in the present modification includes a solid-state imaging element 6 for visible light detection, in addition to the solid-state imaging element 40 in the above-described third embodiment.

FIG. 27*a* is a plan view illustrating a pixel arrangement example of the solid-state imaging element 6 for visible light detection, and FIG. 27*b* is a plan view illustrating a pixel arrangement example of the solid-state imaging element 40 for near infrared light detection. As illustrated in FIG. 27*a*, the solid-state imaging element 6 for visible light detection includes a pixel for detecting red light R, a pixel for detecting green light G, and a pixel for detecting blue light B. Further, as illustrated in FIG. 27*b*, the solid-state imaging element 40 includes a pixel for detecting red light R and red near infrared light NIR-R, a pixel for detecting green light G and green near infrared light NIR-G, and a pixel for detecting blue light B and blue near infrared light NIR-B.

In the imaging device 51 in the present modification, an infrared cut filter 5 may be disposed on a light incident side of the solid-state imaging element 6 for visible light detection. The imaging device 51 in the present modification separates incident light into two components by using an optical element such as a half mirror 4, to let the two components be incident on the solid-state imaging element 6 for visible light detection and the solid-state imaging element 40 for near infrared light detection. Further, the solid-state imaging element 6 for visible light detection detects red light R, green light G, and blue light B; and the solid-state imaging element 40 for near infrared light detection detects red light R, green light G, and blue light B; and near infrared light NIR-R, near infrared light NIR-G, and near infrared light NIR-B having a correlation with these light rays.

Since the imaging device 51 in the present modification detects visible light and near infrared light by individual solid-state imaging elements, as compared with a configuration in which a visible light detection area and a near infrared light detection area are provided on a same element, a pixel configuration is made simple, and it is possible to reduce a manufacturing cost of a solid-state imaging element. Further, in the imaging device 51 in the present modification, since visible light and near infrared light separated from one light are detected by pixels associated with two solid-state imaging elements, it is possible to detect visible light and near infrared light associated therewith per area. Further, since a density between pixels at a same wavelength is increased, it is possible to secure a higher resolution. Note that a configuration and advantageous effects of the imaging device in the present modification other than the above are similar to those in the above-described fifth embodiment.

REFERENCE SIGNS LIST

1, 10, 12, 20, 30 40 Solid-state imaging element
2 Visible light detection area
3 Near infrared light detection area
4 Half mirror
5, 22 Infrared cut filter
6 Solid-state imaging element for visible light detection
11 Photoelectric conversion layer
21B, 21G, 21R Color filter
31B, 31G, 31R Interference filter (near infrared cut filter)
31H$_1$ to 31H$_5$, 31H$_{21}$, 31H$_{22}$, 31H$_{31}$, 31H$_{32}$ High refractive index layer
31L$_0$ to 31L$_4$, 34L$_1$, 34L$_2$ Low refractive index layer
32 Visible light cut filter
33 Antireflection film
41 Signal derived from visible light
42 Signal derived from near infrared light
43 Image generation unit
50, 51 Imaging device

The invention claimed is:
1. A solid-state imaging element comprising:
a visible light detection area for detecting visible light; and
a near infrared light detection area for detecting near infrared light, wherein
in the visible light detection area,
a first visible light pixel for receiving first visible light,
a second visible light pixel for receiving second visible light having a wavelength different from a wavelength of the first visible light, and
a third visible light pixel for receiving third visible light having a wavelength different from the wavelengths of the first visible light and the second visible light are provided, and
in the near infrared light detection area,
a first near infrared light pixel for receiving first near infrared light,
a second near infrared light pixel for receiving second near infrared light having a wavelength different from a wavelength of the first near infrared light, and
a third near infrared light pixel for receiving third near infrared light having a wavelength different from the wavelengths of the first near infrared light and the second near infrared light are provided,
a first interference filter for selectively transmitting the first near infrared light is provided on the first near infrared light pixel,
a second interference filter for selectively transmitting the second near infrared light is provided on the second near infrared light pixel, and
a third interference filter for selectively transmitting the third near infrared light is provided on the third near infrared light pixel,
the first interference filter is a short-pass filter in which a transmittance of near infrared light of a wavelength longer than 800 nm is 50% or less,
the second interference filter is a band-pass filter having a center wavelength of 850 nm, and
the third interference filter is a long-pass filter in which a transmittance of near infrared light of a wavelength shorter than 890 nm is 50% or less.
2. The solid-state imaging element according to claim 1, wherein
an antireflection film is formed on the first near infrared light pixel, the second near infrared light pixel, and the third near infrared light pixel, and
the first interference filter, the second interference filter, and the third interference filter are formed on the antireflection film.

3. The solid-state imaging element according to claim 1, wherein
a visible light cut filter for reflecting and/or absorbing visible light is provided on the first near infrared light pixel, the second near infrared light pixel, and the third near infrared light pixel.

4. The solid-state imaging element according to claim 1, wherein
a first color filter for reflecting and/or absorbing visible light other than the first visible light is provided on the first near infrared light pixel,
a second color filter for reflecting and/or absorbing visible light other than the second visible light is provided on the second near infrared light pixel, and
a third color filter for reflecting and/or absorbing visible light other than the third visible light is provided on the third near infrared light pixel.

5. The solid-state imaging element according to claim 4, wherein
the first color filter, the second color filter, and the third color filter are formed on a layer lower than the first interference filter, the second interference filter, and the third interference filter.

6. The solid-state imaging element according to claim 1, wherein
a first color filter for reflecting and/or absorbing visible light other than the first visible light is provided on the first visible light pixel,
a second color filter for reflecting and/or absorbing visible light other than the second visible light is provided on the second visible light pixel, and
a third color filter for reflecting and/or absorbing visible light other than the third visible light is provided on the third visible light pixel.

7. The solid-state imaging element according to claim 1, wherein
an infrared cut filter for reflecting and/or absorbing infrared light is provided on the first visible light pixel, the second visible light pixel, and the third visible light pixel.

8. A solid-state imaging element comprising:
a first pixel for receiving first near infrared light;
a second pixel for receiving second near infrared light having a wavelength different from a wavelength of the first near infrared light; and
a third pixel for receiving third near infrared light having a wavelength different from the wavelengths of the first near infrared light and the second near infrared light, wherein
a first interference filter for selectively transmitting the first near infrared light, a second interference filter for selectively transmitting the second near infrared light, and a third interference filter for selectively transmitting the third near infrared light are respectively provided on the first pixel, the second pixel, and the third pixel,
each of the first interference filter, the second interference filter, and the third interference filter is configured such that a first dielectric layer, and a second dielectric layer having a refractive index higher than a refractive index of the first dielectric layer are alternately laminated by five layers or more in total,
only a thickness of a layer at an intermediate position in a thickness direction differs among the first interference filter, the second interference filter, and the third interference filter, and thicknesses of layers other than the layer at the intermediate position are the same among the first interference filter, the second interference filter, and the third interference filter,
the first interference filter is such that a thick second dielectric layer having a thickness larger than a thickness of another second dielectric layer is formed at an intermediate position in a thickness direction,
the second interference filter and the third interference filter are such that a thin first dielectric layer having a thickness smaller than a thickness of another first dielectric layer is formed at an intermediate position in a thickness direction, and
a thin first dielectric layer of the second interference filter has a thickness larger than a thickness of a thin first dielectric layer of the third interference filter.

9. The solid-state imaging element according to claim 8, wherein
the first pixel also receives first visible light,
the second pixel also receives second visible light having a wavelength different from a wavelength of the first visible light, and
the third pixel also receives third visible light having a wavelength different from the wavelengths of the first visible light and the second visible light are provided.

10. The solid-state imaging element according to claim 9, wherein
the first pixel further includes a first color filter for reflecting and/or absorbing light other than first visible light,
the second pixel further includes a second color filter for reflecting and/or absorbing light other than second visible light, and
the third pixel further includes a third color filter for reflecting and/or absorbing light other than third visible light.

11. The solid-state imaging element according to claim 8, wherein
an antireflection film is formed on the first pixel, the second pixel, and the third pixel, and
the first interference filter, the second interference filter, and the third interference filter are formed on the antireflection film.

12. The solid-state imaging element according to claim 10, wherein
the first interference filter, the second interference filter, and the third interference filter are formed on a layer upper than the first color filter, the second color filter, and the third color filter.

13. The solid-state imaging element according to claim 1, wherein
any of the first interference filter, the second interference filter, and the third interference filter is configured such that a first dielectric layer, and a second dielectric layer having a refractive index higher than a refractive index of the first dielectric layer are alternately laminated by five layers or more, and
a thickness of a first dielectric layer and a thickness of a second dielectric layer located on a light incident side and on a light exit side are the same among interference filters, and only a thickness of a layer at an intermediate position in a thickness direction differs from one another.

14. The solid-state imaging element according to claim 13, wherein
the first interference filter, the second interference filter, and the third interference filter are such that only a thickness of a second dielectric layer located at an intermediate position in a thickness direction differs from one another.

15. The solid-state imaging element according to claim 13, wherein
the first interference filter is such that a thick second dielectric layer having a thickness larger than a thickness of another second dielectric layer is formed at an intermediate position in a thickness direction,
the second interference filter and the third interference filter are such that a thin first dielectric layer having a thickness smaller than a thickness of another first dielectric layer is formed at an intermediate position in a thickness direction, and
a thin first dielectric layer of the second interference filter has a thickness larger than a thickness of a thin first dielectric layer of the third interference filter.

16. The solid-state imaging element according to claim 13, wherein
a third dielectric layer having a refractive index lower than a refractive index of the second dielectric layer is formed on a light-incident-side outermost layer and/or a light-exit-side outermost layer of the first interference filter, the second interference filter, and the third interference filter.

17. The solid-state imaging element according to claim 1, wherein
the first visible light is red light,
the second visible light is green light,
the third visible light is blue light,
the first near infrared light is light in a near infrared range and having a correlation with the red light,
the second near infrared light is light in a near infrared range and having a correlation with the green light, and
the third near infrared light is light in a near infrared range and having a correlation with the blue light.

18. An imaging device comprising
the solid-state imaging element according to claim 1.

19. The imaging device according to claim 18, further comprising
an image generation unit for analyzing a signal acquired by the solid-state imaging element, and generating a color image based on first visible light, second visible light, and third visible light and/or a color image based on first near infrared light, second near infrared light, and third near infrared light.

20. The solid-state imaging element according to claim 8, wherein
the first interference filter cuts near infrared light having a wavelength of 750 nm or more,
the second interference filter cuts near infrared light having a wavelength from 650 to 900 nm, and
the third interference filter cuts near infrared light having a wavelength from 550 to 860 nm and/or 900 nm or more.

21. The solid-state imaging element according to claim 8, wherein
a third dielectric layer having a refractive index lower than a refractive index of the second dielectric layer is formed on a light-incident-side outermost layer and/or a light-exit-side outermost layer of the first interference filter, the second interference filter, and the third interference filter.

22. The solid-state imaging element according to claim 9, wherein
the first visible light is red light,
the second visible light is green light,
the third visible light is blue light,
the first near infrared light is light in a near infrared range and having a correlation with the red light,
the second near infrared light is light in a near infrared range and having a correlation with the green light, and
the third near infrared light is light in a near infrared range and having a correlation with the blue light.

23. An imaging device comprising
the solid-state imaging element according to claim 8.

24. The solid-state imaging element according to claim 1, wherein
the first to the third visible light pixels and the first to the third near infrared light pixels are on a same plane.

* * * * *